United States Patent
Dubost et al.

(10) Patent No.: US 12,236,523 B2
(45) Date of Patent: *Feb. 25, 2025

(54) SYSTEMS AND METHODS FOR VISUALIZATION OF BUILDING STRUCTURES

(71) Applicant: Certain Teed LLC, Malvern, PA (US)

(72) Inventors: Brice Dubost, Newton, MA (US); Sizhu You, Auburndale, MA (US); Rachel Z. Pytel, Newton, MA (US)

(73) Assignee: CERTAINTEED LLC, Malvern, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/223,048

(22) Filed: Jul. 18, 2023

(65) Prior Publication Data

US 2024/0119663 A1 Apr. 11, 2024

Related U.S. Application Data

(63) Continuation of application No. 17/543,837, filed on Dec. 7, 2021, now Pat. No. 11,704,866, which is a
(Continued)

(51) Int. Cl.
*G06T 15/50* (2011.01)
*G06F 30/20* (2020.01)
(Continued)

(52) U.S. Cl.
CPC ............ *G06T 15/506* (2013.01); *G06F 30/20* (2020.01); *G06T 15/005* (2013.01); *G06T 15/20* (2013.01)

(58) Field of Classification Search
CPC ..... G06T 15/506; G06T 15/005; G06T 15/20; G06F 30/20
See application file for complete search history.

(56) References Cited

U.S. PATENT DOCUMENTS 4,736,253 A 4/1988 Shida
4,970,666 A 11/1990 Welsh et al.
(Continued)

FOREIGN PATENT DOCUMENTS

CN 101329771 A 12/2008
CN 101476885 A 7/2009
(Continued)

OTHER PUBLICATIONS

N. Tatarchuk, "Practical Dynamic Parallax Occlusion Mapping," Presentation, SIGGRAPH 2005 (2005).
(Continued)

*Primary Examiner* — Michelle Chin
(74) *Attorney, Agent, or Firm* — Abel Schillinger, LLP; Thomas H. Osborn

(57) ABSTRACT

Methods and systems for real-time visualization of building structures are disclosed. A computing system may calculate physical illumination characteristics for each of a plurality of predefined virtual external building-surface elements layered in simulation at specified surface locations of a virtual three-dimensional (3D) model of a building structure, wherein the virtual 3D model is constructed based on data descriptive of the building structure. Each of the plurality of predefined virtual external building-surface elements may be associated with its calculated illumination characteristics in a database. A spatially-manipulable rendered image of the building structure may displayed on an interactive display in real-time based on the virtual 3D model. On the interactive display device, one or more of the plurality of the predefined virtual external building-surface elements may be rendered in real-time at respectively specified locations on the rendered image. On the interactive display device, illumination of each of the one or more of the plurality of the predefined virtual external building-surface elements may be simulated
(Continued)

in real-time based on its associated calculated illumination characteristics, its respectively specified location on the rendered image, and a specification of environmental illuminati on conditions.

17 Claims, 7 Drawing Sheets

Related U.S. Application Data continuation of application No. 16/540,835, filed on Aug. 14, 2019, now Pat. No. 11,195,324.

(60) Provisional application No. 62/718,818, filed on Aug. 14, 2018, provisional application No. 62/718,832, filed on Aug. 14, 2018.

(51) Int. Cl.
  *G06T 15/00*       (2011.01)
  *G06T 15/20*       (2011.01)

(56) References Cited

U.S. PATENT DOCUMENTS

| | | | |
|---|---|---|---|
| 4,984,071 A | 1/1991 | Yonezawa | |
| 5,175,807 A | 12/1992 | Cawley | |
| 5,537,638 A | 7/1996 | Morita | |
| 5,553,859 A | 9/1996 | Kelly | |
| 5,572,635 A | 11/1996 | Takizawa | |
| 5,582,961 A | 12/1996 | Giorgianni | |
| 5,609,978 A | 3/1997 | Giorgianni | |
| 5,694,533 A | 12/1997 | Richards et al. | |
| 5,821,917 A | 10/1998 | Cappels | |
| 6,313,823 B1 | 11/2001 | Cappels | |
| 6,320,578 B1 | 11/2001 | Shiitani | |
| 6,339,429 B1 | 1/2002 | Schug | |
| 6,559,702 B2 | 5/2003 | Hinterscher et al. | |
| 6,563,574 B2 | 5/2003 | Ohtomo et al. | |
| 6,744,441 B2 | 6/2004 | Wu | |
| 6,891,980 B2 | 5/2005 | Gerhard | |
| 6,928,384 B2 | 8/2005 | Kochi | |
| 7,068,274 B2 | 6/2006 | Welch et al. | |
| 7,102,648 B1 | 9/2006 | Holub | |
| 7,515,160 B2 | 4/2009 | Kerofsky | |
| 7,668,334 B2 | 2/2010 | Reed et al. | |
| 7,728,833 B2 | 6/2010 | Verma et al. | |
| 7,728,845 B2 | 6/2010 | Holub | |
| 7,739,803 B2 | 6/2010 | Yahagi et al. | |
| 7,764,286 B1 | 6/2010 | Kumar | |
| 7,973,796 B1 | 7/2011 | Marston | |
| 8,077,353 B2 | 12/2011 | Wada | |
| 8,159,524 B2 | 4/2012 | Wilson et al. | |
| 8,259,993 B2 | 9/2012 | Sasakawa et al. | |
| 8,285,050 B2 | 10/2012 | Ozawa | |
| 8,300,986 B2 | 10/2012 | Kochi et al. | |
| 8,339,394 B1 | 12/2012 | Lininger | |
| 8,427,473 B2 | 4/2013 | Elsberg et al. | |
| 8,485,741 B1 | 7/2013 | Bunn et al. | |
| 8,494,211 B2 | 7/2013 | Shimamura et al. | |
| 8,538,151 B2 | 9/2013 | Shimamura et al. | |
| 8,564,607 B2 | 10/2013 | Lee et al. | |
| 8,669,976 B1 | 3/2014 | Fan et al. | |
| 8,687,877 B1 | 4/2014 | Fan et al. | |
| 8,749,580 B1 | 6/2014 | Lininger | |
| 8,817,018 B1 | 8/2014 | Fan et al. | |
| 8,817,067 B1 | 8/2014 | Fan et al. | |
| 8,818,768 B1 | 8/2014 | Fan et al. | |
| 8,866,850 B1 | 10/2014 | Fan et al. | |
| 8,872,811 B1 | 10/2014 | Rump | |
| 8,902,288 B1 | 12/2014 | Fan et al. | |
| 9,019,375 B1 | 4/2015 | Whelan et al. | |
| 9,106,805 B2 | 8/2015 | Kumagai et al. | |
| 9,354,054 B2 | 5/2016 | Kumagai et al. | |
| 9,437,044 B2 | 9/2016 | Ege et al. | |
| 10,217,242 B1 | 2/2019 | Pytel et al. | |
| 10,373,343 B1 | 8/2019 | Pytel et al. | |
| 11,195,324 B1 | 12/2021 | Dubost | |
| 11,704,866 B2 | 7/2023 | Dubost | |
| 2002/0154814 A1 | 10/2002 | Gerhard et al. | |
| 2003/0007700 A1 | 1/2003 | Gutta et al. | |
| 2003/0025788 A1* | 2/2003 | Beardsley | G06T 17/00 348/43 |
| 2003/0034976 A1* | 2/2003 | Raskar | G06T 15/005 345/630 |
| 2003/0043152 A1 | 3/2003 | Raskar | |
| 2003/0063084 A1 | 4/2003 | Burke | |
| 2003/0122843 A1 | 7/2003 | Lai et al. | |
| 2003/0179915 A1 | 9/2003 | Goto | |
| 2004/0012542 A1 | 1/2004 | Bowsher | |
| 2004/0076315 A1 | 4/2004 | Scoll et al. | |
| 2005/0074179 A1 | 4/2005 | Wilensky | |
| 2005/0134918 A1 | 6/2005 | Reed | |
| 2005/0141754 A1 | 6/2005 | Lo | |
| 2005/0243336 A1 | 11/2005 | Kuhn | |
| 2005/0259034 A1 | 11/2005 | Harada | |
| 2006/0017938 A1 | 1/2006 | Ohtomo et al. | |
| 2006/0232792 A1 | 10/2006 | Kobayashi | |
| 2006/0282769 A1 | 12/2006 | Bronstein | |
| 2007/0035755 A1 | 2/2007 | Maki et al. | |
| 2007/0216709 A1 | 9/2007 | Kojima et al. | |
| 2008/0063299 A1 | 3/2008 | Murai et al. | |
| 2008/0158142 A1 | 7/2008 | Zhou et al. | |
| 2008/0310754 A1 | 12/2008 | Safai et al. | |
| 2009/0141966 A1 | 6/2009 | Chen et al. | |
| 2010/0033371 A1 | 2/2010 | Kumagai et al. | |
| 2010/0060943 A1 | 3/2010 | Monga et al. | |
| 2010/0097407 A1 | 4/2010 | Zulch | |
| 2010/0103266 A1 | 4/2010 | Merkel et al. | |
| 2010/0121540 A1 | 5/2010 | Kumagai et al. | |
| 2010/0123648 A1 | 5/2010 | Miller et al. | |
| 2010/0123651 A1 | 5/2010 | Miller et al. | |
| 2010/0241406 A1 | 9/2010 | Rahmes et al. | |
| 2010/0246971 A1 | 9/2010 | Ohtsubo et al. | |
| 2010/0253684 A1 | 10/2010 | Yang et al. | |
| 2011/0002529 A1 | 1/2011 | Jeong et al. | |
| 2011/0050855 A1 | 3/2011 | Nobis et al. | |
| 2011/0141497 A1 | 6/2011 | Williamowski et al. | |
| 2011/0181589 A1* | 7/2011 | Quan | G06T 17/05 345/420 |
| 2011/0243587 A1 | 10/2011 | No | |
| 2012/0013635 A1 | 1/2012 | Beeman et al. | |
| 2012/0019493 A1 | 1/2012 | Bahhoefer et al. | |
| 2012/0050307 A1 | 3/2012 | Mahowald et al. | |
| 2012/0056911 A1 | 3/2012 | Safaee-Rad | |
| 2012/0063680 A1 | 3/2012 | Daisy | |
| 2012/0179431 A1 | 7/2012 | Labrie et al. | |
| 2012/0197600 A1 | 8/2012 | Bai et al. | |
| 2012/0243008 A1 | 9/2012 | Chatow et al. | |
| 2012/0249536 A1 | 10/2012 | Sutou | |
| 2013/0127847 A1 | 5/2013 | Jin et al. | |
| 2013/0155119 A1 | 6/2013 | Dai et al. | |
| 2013/0278755 A1 | 10/2013 | Starns et al. | |
| 2013/0314410 A1 | 11/2013 | Gravois et al. | |
| 2013/0328871 A1 | 12/2013 | Piemonte et al. | |
| 2013/0343603 A1 | 12/2013 | Choi et al. | |
| 2014/0043321 A1 | 2/2014 | Matjasko et al. | |
| 2014/0092068 A1 | 4/2014 | Zheng et al. | |
| 2014/0210802 A1 | 7/2014 | Myers et al. | |
| 2014/0240477 A1 | 8/2014 | Feng et al. | |
| 2014/0320488 A1 | 10/2014 | Ege | |
| 2015/0054846 A1 | 2/2015 | Okada et al. | |
| 2015/0125047 A1 | 5/2015 | Ikenoue | |
| 2015/0154786 A1 | 6/2015 | Furukawa et al. | |
| 2015/0213315 A1* | 7/2015 | Gross | G06T 5/50 382/159 |
| 2015/0213590 A1 | 7/2015 | Brown et al. | |
| 2015/0254889 A1 | 9/2015 | Bakalash | |
| 2015/0286868 A1 | 10/2015 | Flores et al. | |
| 2015/0324989 A1 | 11/2015 | Smith et al. | |
| 2015/0348314 A1 | 12/2015 | Koguchi et al. | |
| 2016/0062956 A1 | 3/2016 | Gotman et al. | |
| 2016/0127630 A1 | 5/2016 | Kitajima | |
| 2016/0210087 A1 | 7/2016 | Amir et al. | |

(56) References Cited

U.S. PATENT DOCUMENTS

| | | |
|---|---|---|
| 2016/0352976 A1 | 12/2016 | Kuroiwa |
| 2017/0148161 A1 | 5/2017 | Griffin |
| 2017/0228878 A1* | 8/2017 | Goldman ............... G06T 11/60 |
| 2018/0012397 A1 | 1/2018 | Carothers |
| 2018/0122143 A1* | 5/2018 | Ellwood, Jr. ............ G02B 5/30 |

FOREIGN PATENT DOCUMENTS

| | | |
|---|---|---|
| CN | 101510311 A | 8/2009 |
| CN | 101545775 A | 9/2009 |
| CN | 101614807 A | 12/2009 |
| CN | 101908228 A | 7/2010 |
| CN | 101915572 A | 12/2010 |
| CN | 201795797 U | 4/2011 |
| CN | 102175263 A | 9/2011 |
| CN | 102213593 A | 10/2011 |
| JP | 2003346144 A | 12/2003 |
| JP | 2004117245 A | 4/2004 |
| JP | 2004212302 A | 7/2004 |
| JP | 2005017262 A | 1/2005 |
| JP | 2005156514 A | 6/2005 |
| JP | 2012103134 A | 5/2012 |
| JP | 2012146050 A | 8/2012 |
| JP | 2012255286 A | 12/2012 |
| JP | 2013036243 A | 2/2013 |
| JP | 2013205419 A | 10/2013 |
| JP | 2014089078 A | 5/2014 |
| JP | 2014106118 A | 6/2014 |
| WO | 2008058788 A1 | 5/2008 |
| WO | 2010066698 A1 | 6/2010 |
| WO | 2011085433 A1 | 7/2011 |
| WO | 2011085434 A1 | 7/2011 |
| WO | 2011085435 A1 | 7/2011 |
| WO | 2011085436 A1 | 7/2011 |
| WO | 2011085437 A1 | 7/2011 |
| WO | 2013143982 A1 | 10/2013 |

OTHER PUBLICATIONS

F. Policarpo and M.M. Oliveira, "Relaxed Cone Stepping for Relief Mapping," Chapter 18 in GPU Gems 3, Addison-Wesley Professional (2007).

"Baking Lighting in 3ds Max: A General Overview, Part 1," available at http://kb.worldviz.com/articles/2686 (2017).

"Baking Lighting in 3ds Max: A General Overview, Part 2," available at http://kb.worldviz.com/articles/2686 (2017).

C. Green, "Efficient Self-Shadowed Radiosity Normal Mapping," Advanced Real-Time Rendering in 3D Graphics and Games Course—SIGGRAPH 2007 (2007).

L. Wang et al., "View-Dependent Displacement Mapping," SIGGRAPH 2003 (2003).

S. Hill et al., "Physically Based Shading in Theory and Practice," ACM SIGGRAPH Courses, Aug. 2014 (2014) (Abstract only).

N. Tatarchuk, "Dynamic Parallax Occlusion Mapping With Appropriate Soft Shadows," Proceedings of the 2006 symposium on Interactive 3D graphics and games (2006).

* cited by examiner

SYSTEMS AND METHODS FOR VISUALIZATION OF BUILDING STRUCTURES

BACKGROUND

This application is a continuation of U.S. patent application Ser. No. 17/543,837, filed Dec. 7, 2021, now U.S. Pat. No. 11,704,866, which is a continuation of U.S. Patent Application Ser. No. 16/540,835, filed Aug. 14, 2019, now U.S. Pat. No. 11,195,324, which claims the benefit of priority of U.S. Provisional Patent Applications Nos. 62/718,818, filed Aug. 14, 2018, and 62/718,832, filed Aug. 14, 2018, all of which are hereby assigned to the current assignee hereof and are incorporated herein by reference in their entireties.

BACKGROUND

In the building and construction industry, computer visualization can be a helpful tool for planning projects and making aesthetic choices for surface-finishing products and other exposed building components. An example technique for computer visualization in a renovation project may include merging photographic images of an existing building structure under renovation or construction, such as a house, with photographic images of surface-finishing products, such as roofing shingles or siding. Merging of images may also make use of rendered images (e.g., computer-generated, virtual images) of all or part of a building structure and/or of surface-finishing products.

Computer visualization may allow an owner of a building structure under renovation or construction to obtain a virtual view of what a finished project will look like subject to various possible options of exposed building components or surface-finishing products. Likewise, a builder or contractor can evaluate options, and engage with the owner in considering aesthetic design choices for a project. The quality, accuracy, and efficiency of visualization systems and techniques may therefore be of interest to a building owner and/or construction/renovation contractor or business.

SUMMARY

The present inventors have recognized that while a variety of techniques may exist for computer generation of merged real and/or virtual images for visualization of building and renovation projects, there remain significant deficiencies in the ability to create images that appear natural and realistic. The inventor has similarly recognized that there are unmet challenges in generating natural and realistic appearing images in real-time and in response to real-time user interaction with a graphical visualization tool, such as a laptop computer or computer tablet. In particular, the inventor has identified two related problems that can limit the realism of synthesized images of building and renovation projects, and impede the real-time responsiveness of systems that create and display the images.

Both problems may be illustrated by way of a common example use case involving home or building renovation. A home owner may engage a contractor to install a new roof or new siding on a home, for example. The contractor may, through various means described below, generate a virtual three-dimensional (3D) model of the owner's home, from which a computer-graphic drawing, or "rendered" image, representing the existing home may be created. The rendered image may be displayed to the home owner on a portable display device, such as a tablet, and the home owner may cycle through different options of available roofing shingles and/or siding applied in simulation on the rendered image, thereby visualizing how they would look on his or her home. The ability to interactively select and change product options in real-time is therefore an important aspect of this example use case, as is the apparent realism and naturalness of each image.

The displayed image may also incorporate photographic elements or components from one or more acquired images of the existing home. For example, actual trees and/or landscaping of the actual environment of the home may be merged with the rendered image in order to further enhance the realism of the image on the display device. Effectively superimposing a rendered image of the simulated renovation of the home into a photographic image may be one component of a merging operation. However, the inventor has recognized that the rendered image should be generated so it appears as if photographed by the same camera device and perspective that captured the photographic images, and with simulated illumination as closely matched as possible to the illumination in the actual image of the home in the acquired photographic images. Otherwise, the merged image may appear unnatural, undermining the viewer's (e.g., home owner's) confidence in the evaluation of the product options.

The first problem, then, relates to computational simulation of realistic illumination in rendered images in a way that supports real-time, interactive display of rendered objects. Illumination of actual objects, such as existing buildings and their environments, is governed by physical processes of light emission, propagation, reflection, absorption, and diffraction, and involves sources of light, physical properties (e.g., colors and/or textures) of reflecting and absorbing surfaces, and multiple components of reflected light paths, among other factors. Illumination in rendering thus involves simulation and/or modeling the physical illumination processes as applied to the rendered objects. The accuracy and associated complexity of the computational illumination therefore may determine how realistic the rendered image appears to a viewer. For the example use case of applying roofing shingles or siding to a rendered image of a house, the realism of such an image—in particular, the illumination—can play an important role in the viewer's (e.g., home owner's) aesthetic judgement of the product options. The inventor has recognized that the computational cost of existing techniques for realistic simulated illumination in rendered images make those techniques impractical for implementation in real-time applications in which product options (e.g. roofing shingles, siding, etc.) may be interactively switched, or the images otherwise manipulated.

The second problem relates to how to: (1) render an image of an object, such as a house, so that it appears from the same perspective, with the same camera response, and illuminated in the same way as the real object in a photographic image, and (2) replace the real object in the photographic image with the rendered image of the object such that the rendered object looks natural in the merge image. In some instances, the rendered object may be or include elements not present in the real object in the photograph, so the replacement may thus bring those additional elements into the photograph. The inventor has recognized that conventional techniques for this type of merging of real and virtual images involve a significant amount of manual intervention and trial and error, making them unsuitable or impractical for applications that require or involve rendering an object with multiple design options, and/or real-time merging.

In order to address the deficiencies of existing techniques, and to solve the problems described by way of example above, the inventor has devised efficient techniques and approaches for illumination in rendered images that enable both real-time selection of different components of rendered images, and merging of rendered and real images that appear natural and realistic. In particular, illumination in rendered images that enable both real-time selection of different components of rendered images may be achieved by pre-computing illumination of components that may subsequently be manipulated in real-time. Merging of rendered and real images may be achieved by rendering an image of an object in a photographic image using simulated conditions of image capture that match those of the actual image capture, and then replacing the object in the actual image with the rendered object.

Accordingly, a first example embodiment may involve a method for real-time visualization of building structures, the method comprising: calculating physical illumination characteristics for each of a plurality of predefined virtual external building-surface elements layered in simulation at specified surface locations of a virtual three-dimensional (3D) model of a building structure, wherein the virtual 3D model is constructed based on data descriptive of the building structure; associating each of the plurality of predefined virtual external building-surface elements with its calculated illumination characteristics in a database; on an interactive display device, generating a spatially-manipulable rendered image of the building structure in real-time based on the virtual 3D model; on the interactive display device, rendering, in real-time, one or more of the plurality of the predefined virtual external building-surface elements at respectively specified locations on the rendered image; and on the interactive display device, simulating illumination of each of the one or more of the plurality of the predefined virtual external building-surface elements in real-time based on its associated calculated illumination characteristics, its respectively specified location on the rendered image, and a specification of environmental illumination conditions.

A second example embodiment may involve a method for real-time visualization of building structures, the method comprising: calculating physical illumination characteristics for each of a plurality of predefined virtual external building-surface elements layered in simulation at specified surface locations of a virtual three-dimensional (3D) model of a building structure, wherein the virtual 3D model is constructed based on data descriptive of the building structure; associating each of the plurality of predefined virtual external building-surface elements with its calculated illumination characteristics in a database; on an interactive display device, generating a spatially-manipulable rendered image of the building structure in real-time based on the virtual 3D model; on the interactive display device, rendering, in real-time, one or more of the plurality of the predefined virtual external building-surface elements at respectively specified locations on the rendered image; and on the interactive display device, simulating illumination of each of the one or more of the plurality of the predefined virtual external building-surface elements in real-time based on its associated calculated illumination characteristics, its respectively specified location on the rendered image, and a specification of environmental illumination conditions.

A third example embodiment may involve A computing system configured for real-time visualization of building structures, the computing system comprising: a database; one or more processors; and memory storing instructions that, when executed by the one more processors, cause the computing system to carry out operations including: calculating physical illumination characteristics for each of a plurality of predefined virtual external building-surface elements layered in simulation at specified surface locations of a virtual three-dimensional (3D) model of a building structure, wherein the virtual 3D model is constructed based on data descriptive of the building structure; and associating each of the plurality of predefined virtual external building-surface elements with its calculated illumination characteristics in a database, wherein the plurality of predefined virtual external building-surface elements and the associated calculated illumination characteristics in the database are configured for a simulation of illumination in an interactive image in an interactive display device, wherein the simulation of illumination comprises: generating a spatially-manipulable rendered image of the building structure in real-time based on the virtual 3D model; rendering, in real-time, one or more of the plurality of the predefined virtual external building-surface elements at respectively specified locations on the rendered image; and simulating illumination of each of the one or more of the plurality of the predefined virtual external building-surface elements in real-time based on its associated calculated illumination characteristics, its respectively specified location on the rendered image, and a specification of environmental illumination conditions.

A fourth example embodiment may involve a display device configured for real-time visualization of building structures, the display device comprising: a graphical display component; one or more processors; and memory storing instructions that, when executed by the one or more processors, cause the display device to carry out operations including: retrieving at least a subset of illumination data from a computing system communicatively connected with the display device, wherein the illumination data comprise: a plurality of predefined virtual external building-surface elements, each associated with respective pre-computed illumination characteristics, wherein the associated pre-computed illumination characteristics for each given predefined virtual external building-surface element of the plurality comprise physical illumination characteristics calculated for the given predefined virtual external building-surface elements as layered in simulation at a specified surface location of a virtual three-dimensional (3D) model of a building structure; in the graphical display component, generating a spatially-manipulable rendered image of the building structure in real-time based on the virtual 3D model; in the graphical display component, rendering, in real-time, one or more of the plurality of the predefined virtual external building-surface elements at respectively specified locations on the rendered image; and in the graphical display component, simulating illumination of each of the one or more of the plurality of the predefined virtual external building-surface elements in real-time based on its associated calculated illumination characteristics, its respectively specified location on the rendered image, and a specification of environmental illumination conditions.

A fifth example embodiment may involve an article of manufacture including a non-transitory computer-readable medium having stored thereon program instructions for real-time visualization of building structures, wherein the program instructions, upon execution by one or more processors of a system, cause the system to perform operations including: calculating physical illumination characteristics for each of a plurality of predefined virtual external building-surface elements layered in simulation at specified surface locations of a virtual three-dimensional (3D) model of a building structure, wherein the virtual 3D model is constructed based on data descriptive of the building structure; associating each of the plurality of predefined virtual external building-surface elements with its calculated illumination characteristics in a database; on an interactive display device, generating a spatially-manipulable rendered image of the building structure in real-time based on the virtual 3D model; on the interactive display device, rendering, in real-time, one or more of the plurality of the predefined virtual external building-surface elements at respectively specified locations on the rendered image; and on the interactive display device, simulating illumination of each of the one or more of the plurality of the predefined virtual external building-surface elements in real-time based on its associated calculated illumination characteristics, its respectively specified location on the rendered image, and a specification of environmental illumination conditions.

In a sixth example embodiment, a system may include various means for carrying out each of the operations of the first and/or second example embodiment.

A seventh example embodiment may involve a method for integration of real and virtual images for visualization of building construction, the method comprising: in a computing device, constructing a virtual three-dimensional (3D) model of a building structure at a given location based on data descriptive of the building structure; in the computing device, generating a rendered image of the building structure as viewed from a simulated viewing point corresponding to an actual viewing point of a camera device during acquisition of an image of the building structure, the rendered image further being based at least on the 3D model and image information associated with the acquired image and comprising data indicative of acquisitional circumstances of the acquired image; in the computing device, determining a masked portion of the acquired image occupied only by the building structure; and on a display device, generating a merged image of the acquired image and the rendered image in which the rendered image occupies the masked portion of the acquired image.

A eighth example embodiment may involve a system configured for integration of real and virtual images for visualization of building construction, the system comprising: a computing system; and a display device communicatively connected with the computing system, wherein the computing system is configured to: construct a virtual three-dimensional (3D) model of a building structure at a given location based on data descriptive of the building structure; generate a rendered image of the building structure as viewed from a simulated viewing point corresponding to an actual viewing point of a camera device during acquisition of an image of the building structure, the rendered image further being based at least on the 3D model and image information associated with the acquired image and comprising data indicative of acquisitional circumstances of the acquired image; and determine a masked portion of the acquired image occupied only by the building structure, and wherein the display device is configured to: generate a merged image of the acquired image and the rendered image in which the rendered image occupies the masked portion of the acquired image.

A ninth example embodiment may involve a computing system configured for integration of real and virtual images for visualization of building construction, the computing system comprising: one or more processors; and memory storing instructions that, when executed by the one or more processors, cause the computing system to carry out operations including: constructing a virtual three-dimensional (3D) model of a building structure at a given location based on data descriptive of the building structure; generating a rendered image of the building structure as viewed from a simulated viewing point corresponding to an actual viewing point of a camera device during acquisition of an image of the building structure, the rendered image further being based at least on the 3D model and image information associated with the acquired image and comprising data indicative of acquisitional circumstances of the acquired image; determining a masked portion of the acquired image occupied only by the building structure and, wherein the acquired image and the rendered image are configured to be merged by replacing the masked portion with the acquired image.

A tenth example embodiment may involve a display device configured for integration of real and virtual images for visualization of building construction, the display device comprising: a graphical display component; one or more processors; and memory storing instructions that, when executed by the one or more processors, cause the display device to carry out operations including: generating a merged image of an acquired image of a building structure and a simulated image of the building structure by replacing a masked portion of the acquired image occupied only by the building structure with the rendered image, wherein the simulated image comprises: a rendered image of the building structure as viewed from a simulated viewing point corresponding to an actual viewing point of a camera device during acquisition of the acquired image of the building structure, the rendered image further being based at least on a virtual three-dimensional (3D) model of the building structure and image information associated with the acquired image and comprising data indicative of acquisitional circumstances of the acquired image; and wherein the virtual 3D model of a building structure is constructed based on at a data descriptive of the building structure.

A eleventh example embodiment may involve an article of manufacture including a non-transitory computer-readable medium having stored thereon program instructions for integration of real and virtual images for visualization of building construction, wherein the program instructions, upon execution by one or more processors of a system, cause the system to perform operations including: constructing a virtual three-dimensional (3D) model of a building structure at a given location based on data descriptive of the building structure; generating a rendered image of the building structure as viewed from a simulated viewing point corresponding to an actual viewing point of a camera device during acquisition of an image of the building structure, the rendered image further being based at least on the 3D model and image information associated with the acquired image and comprising data indicative of acquisitional circumstances of the acquired image; determining a masked portion of the acquired image occupied only by the building structure; on an interactive display device, generating a merged image of the acquired image and the rendered image in which the rendered image occupies the masked portion of the acquired image.

In a twelfth example embodiment, a system may include various means for carrying out each of the operations of the first and/or second example embodiment.

These as well as other embodiments, aspects, advantages, and alternatives will become apparent to those of ordinary skill in the art by reading the following detailed description, with reference where appropriate to the accompanying drawings. Further, this summary and other descriptions and figures provided herein are intended to illustrate embodiments by way of example only and, as such, that numerous variations are possible. For instance, structural elements and process steps can be rearranged, combined, distributed, eliminated, or otherwise changed, while remaining within the scope of the embodiments as claimed.

DETAILED DESCRIPTION

Figure 1:
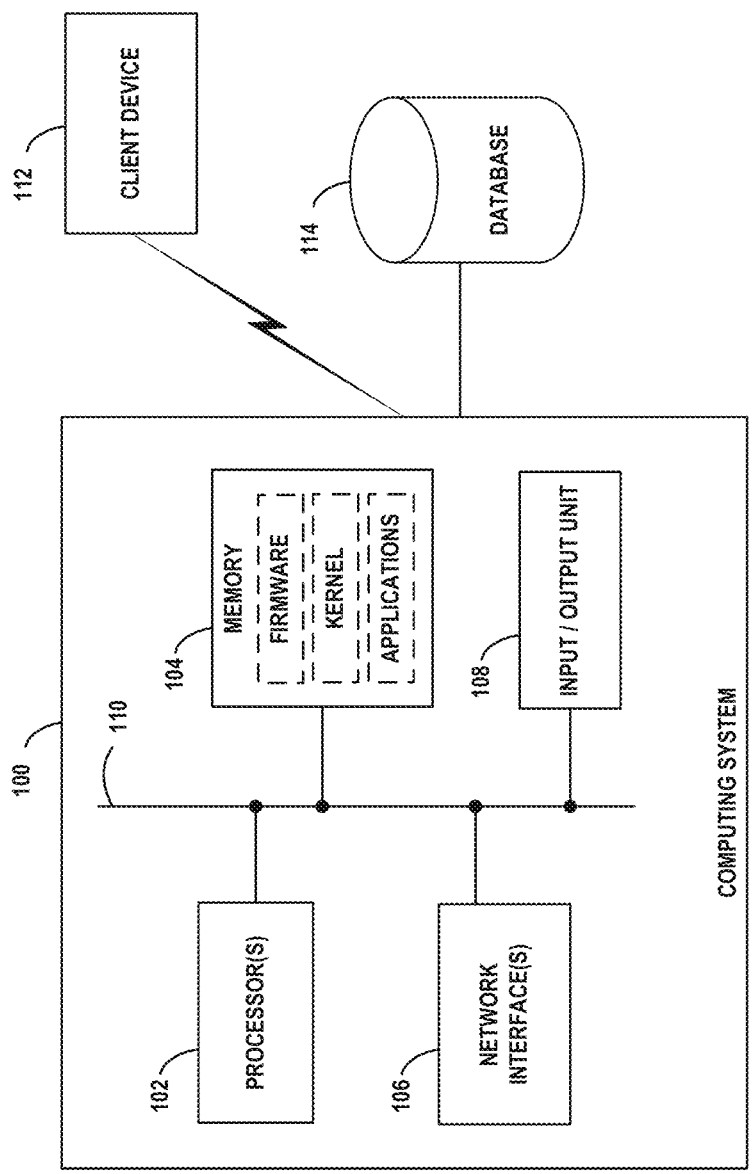
FIG. 1 illustrates a schematic drawing of an example computing device, in accordance with example embodiments.

Embodiments involving example methods, devices, and systems are described herein by way of example in the context of home or building renovation projects. More particularly, a somewhat generic example use case, as briefly described above, may involve a home owner engaging a contractor for installation of a new roof, new siding, and/or other exterior surface-finishing product. The contractor may use an interactive, real-time display that provides graphical, simulated visualizations of what various product options would look like in a finished version of the renovation project. The visualizations may allow the home owner to see how various product options look in simulation before making an actual choice or selection. From a business perspective, the contractor may be interested in a visualization tool that can be used in real-time and that produces realistic and/or natural looking images. This helps instill confidence in the contractor and secure the home owner's business. The realism and accuracy of the visualizations may likewise help the home owner gain confidence in his or her aesthetic judgement of the product options, which in turn could be a factor in the home owner's choice of the contractor over other possible contractors. It should be understood that the example use case involve a contractor and a home owner is not intended to be limiting. An additional or alternative use case could involve only a contractor or only a home owner, for instance. Each such use case could involve similar types of visualizations.

It will also be appreciated that the example methods, devices, and systems described herein may be applied more broadly than in just the example embodiments. For example, there may be other use cases of interactive, real-time display of simulated visualizations that benefit from the techniques, tools, and devices described herein, beside those use cases involving building construction and renovation. Thus, the example methods, devices, and systems described herein are not limited to use or application in building construction and renovation.

Example embodiments described herein involve rendered images, or rendering of images, and the merging or synthesis of rendered and real (e.g., photographic) images of actual objects, such as existing building structures. As used herein the terms "rendered," "rendering," and the like, applied to imaging or images refers to graphical computer generation of a simulated or virtual image, such as a visual scene and/or objects that occupy the visual scene. In the simplest sense, a rendered image may be considered a form of computer drawing, though generally with some intent to appear realistic. Typically, a rendered image may be displayed on a two-dimensional (2D) display device, such as a computer (e.g., laptop, tablet, smartphone, etc.) screen, though the image may appear to a viewer as three dimensional (3D). It may also be possible to render an actual 3D image, such as one displayed on a 3D display device (e.g., a stereoscopic display, a virtual reality device or headset, or an augmented reality device or headset) or as a hologram. For purposes of the discussion herein, and by way of example, rendered images, as well as photographic images (e.g., digital images) will be considered as being displayed or displayable on a 2D display device, such as a computer monitor screen. It will be appreciated, however, that example embodiments described herein are not limited only to 2D display devices or 2D rendering techniques, but that they may be extended to 3D display devices and 3D rendering techniques. For example, the techniques, methods, systems and devices described herein could be used to generate, display, and/or manipulate holographic images (holograms).

Example embodiments disclosed herein may include computing systems and/or devices and methods carried out by the computing systems and/or devices. Example computing systems and/or devices may include one or more special and/or general purpose processes, volatile and non-volatile storage, including non-transient machine readable media, such as magnetic disk, solid state memory, among others. Systems may also include a user interface, including interactive input devices, such as keyboards, and display devices and graphical user interfaces (GUIs).

Example methods may be implemented as machine language instructions stored on one or another forms of the system storage, and accessible by the one or more processors, and that, when executed by the one or more processors cause the system and/or device to carry out the various operations and functions of the methods described herein.

Example Devices, Systems, and Network

FIG. 1 is a simplified block diagram of an example computing device 100, according to example embodiments. As shown, the computing device 100 includes processor(s) 102, memory 104, network interface(s) 106, and an input/output unit 108. By way of example, the components are communicatively connected by a bus 110. The bus could also provide power from a power supply (not shown).

Also by way of example, the memory 104 may include firmware, a kernel, and applications, among other forms and functions of memory. As described, the memory 104 may store machine-language instructions, such as programming code, that may be executed by the processor(s) 102 in order to carry out operations that implement various example methods and techniques, or aspects of example methods and techniques, described herein.

The network interface(s) 106 may provide network connectivity to the computing device 100, such as to the internet or other public and/or private networks. The input/output unit 108 may interface with one or more input/output devices or components, such as an end-user terminal, keyboard, display, or other input/output elements or facilities.

Although the computing device 100 is depicted a single entity, it could be implemented as a distributed system of communicatively connected devices, such as servers. By way of example, distributed devices could be connected via local area networks, wide area networks, and/or other types of communication and/or data networks, such as an internet. For purposes of discussion herein, the term "computing device" will be taken to apply to a single device or server, or a distributed system. Accordingly, example embodiments herein are not limited to any one particular configuration of computing device, and single, distributed, and hybrid single/distributed computing systems are non-limiting examples of computing devices that may be used in example embodiments.

FIG. 1 also includes a client device 112 and a database 114, both shown as being communicatively connected with the computing device 100. Each communicative connection could be a direct connection or a network connection, for example. The client device may be a user client or terminal that includes an interactive display, such as a GUI. It may be used for user access to programs, applications, and data of the system 100. For example, a GUI could be used for display and/or manipulation of rendered and/or merged images of building structures with surface-finishing products applied in simulation. In consideration of the possible GUI functionality of the client device 112, the term "display device" will also be used instead of, or when referring to, a client device.

The database 114 could include data describing various product options of surface-finishing elements offered by or available from a contractor, such as options for roofing shingles or siding (and other possible products described elsewhere herein). For example, roofing shingles could be organized according to multiple product lines, with multiple color choices in each line. A similar arrangement could be used for siding. The term "surface-finishing elements" is used herein to refer to any sort of product or building component that might be fastened to, or adorn, or otherwise be viewed as part of a building exterior. These may range from cosmetic updates to building additions. Thus, non-limiting examples of surface-finishing elements could also include windows, accessories such as trim and/or corners, stone or masonry, decks, railings, fences, and building extensions. The database 114 could thus store digital photographs of each product line and color (and other options), or rendered images of structural extensions or additions (e.g., custom decks, building additions, etc.), together with other descriptive information. As described below, the database 114 could also be used to store rendering and simulation results for multiple of a contractor's renovation and/or building projects. Such stored results may facilitate one or more of the advantageous techniques described here. Other types of products could be stored in database 114 as well, such as other example types of surface-finishing elements.

Figure 2:
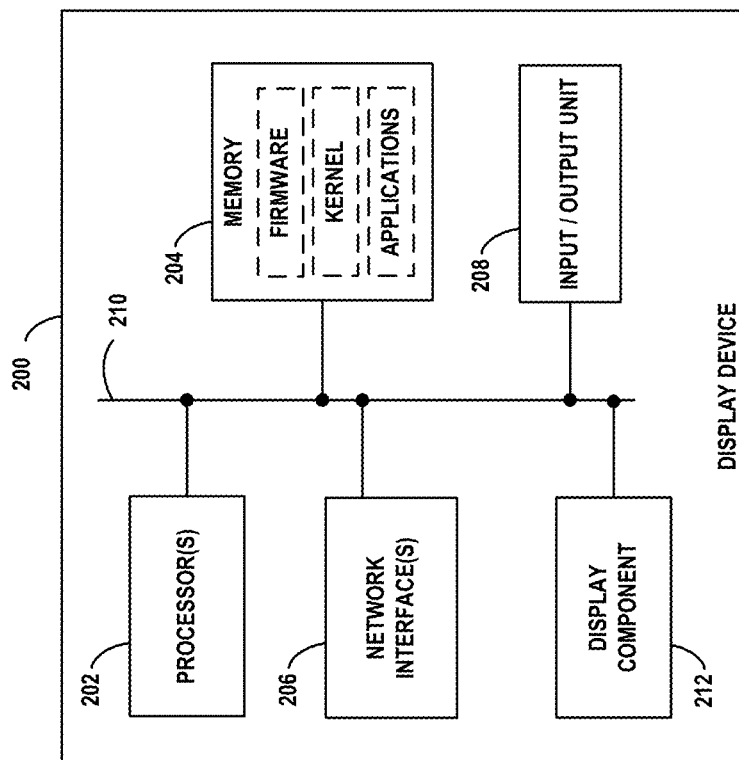
FIG. 2 illustrates a schematic drawing of an example display device cluster, in accordance with example embodiments.

FIG. 2 is a simplified block diagram of an example display device 200, according to example embodiments. The display device 200 may be an example of, or a component of, the client device 112 illustrated in FIG. 1. As shown, the display device 200 includes processor(s) 202, memory 204, network interface(s) 206, and an input/output unit 208. By way of example, the components are communicatively connected by a bus 210. The bus could also provide power from a power supply (not shown). Non-limiting examples of a display device 200 include a laptop computer, an end-user terminal, a tablet computer, and a smartphone or other personal digital assistant (PDA).

Also by way of example, the memory 204 may include firmware, a kernel, and applications, among other forms and functions of memory. As described, the memory 204 may store machine-language instructions, such as programming code, that may be executed by the processor(s) 202 in order to carry out operations that implement various example methods and techniques, or aspects of example methods and techniques, described herein.

The network interface(s) 206 may provide network connectivity to the display device 200, such as to the internet or other public and/or private networks. The input/output unit 208 may interface with one or more input/output components, such as an end-user terminal, keyboard, display screen or monitor, or other input/output elements or facilities.

Figure 3:
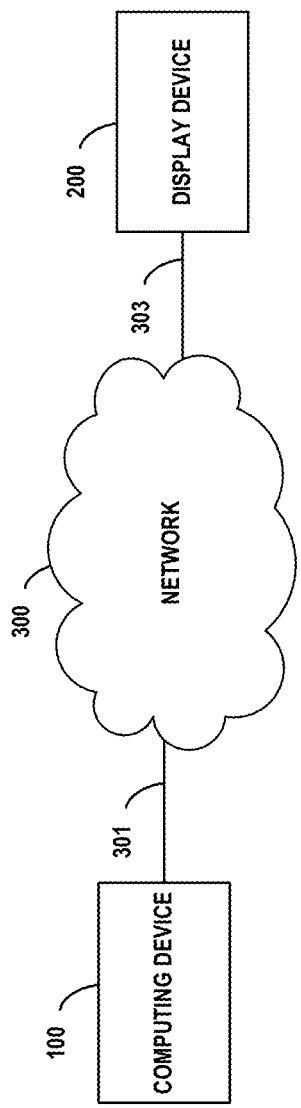
FIG. 3 depicts a simplified view of an example network, in accordance with example embodiments.

FIG. 3 depicts a simplified view of an example network 300, in accordance with example embodiments. The network 300 may be used to communicatively connect the computing device 100 and the display device 200, as shown. The connection 301 between the computing device 100 and the network 300 could be a landline, wireless, or some combination of the two. Similarly, the connection 303 between the display device 200 and the network 300 could also be a landline, wireless, or some combination of the two. For purposes of illustration and brevity in FIG. 3, no other devices or network components are depicted. It will be appreciated, however, that the network 300 may include a variety of devices, such as routers, switches, wireless base stations, wireless access points, base station controllers, firewalls, and servers. Particular network configurations and/or network architectures are not limiting with respect to example embodiments herein.

Illustrative Operation of Example Visualization Techniques

As discussed briefly above, there are two related problems faced in computer visualizations of building construction and renovation. Characterizing at a high level, these problems relate to: (1) realistically illuminating objects in rendered images in such a way that they may be adjusted and/or manipulated in real-time in an interactive display device, and (2) simulating perspective, camera response, and illumination of rendered objects to match the corresponding actual properties and characteristics in photographic images, and then merging the rendered and actual photographic images. Example embodiments disclosed herein provide solutions to both problems. In the following discussion, each solution is first illustrated conceptually in operational terms. Each conceptual illustration is followed by descriptions of further details of example embodiments. For purposes of the discussion, example embodiments of solutions to the first problem are referred to as "illumination in rendered images used in real-time visualizations." Example embodiments of solutions to the second problem are referred to as "simulated photographic rendering of images for merging with real photographic images."

Example embodiments of both solutions may involve generating a 3D model of a building structure under construction or renovation, and simulating placement of surface-finishing elements or other external components on the 3D model. Again, non-limiting examples of surface-finishing elements may include roofing shingles, siding, windows, accessories such as trim and/or corners, stone or masonry, decks, railings, fences, and building extensions. A rendered image of the 3D model may then be generated. The rendered image may represent what the actual building structure would look like with the actual surface-finishing elements applied, installed, or attached. It should be noted that the 3D model need not encompass an entire buildings structure, but could just be part of a building structure, such as a portion of a roof that is going to be replaced, for example. How the rendered images are used in visualization is, in part, what gives rise to the two related problems.

Illumination in Rendered Images Used in Real-Time Visualizations.

A general challenge in image rendering of objects is making the rendered objects appear to be illuminated in a realistic manner. That is, as if the rendered object is actually illuminated by real light— e.g., light having multiple sources, multiple paths, multiple reflections off of multiples surfaces having multiple reflective and absorptive properties and multiple textures, and multiple shadows, among other factors present in real images. The term "realistic illumination" is used herein to refer to the illumination aspect of rendering. One aspect of the problem of realistically illuminating objects in rendered images in such a way that they may be adjusted and/or manipulated in real-time in an interactive display device that simulating realistic illumination in rendered images is computationally complicated and expensive. Consequently, it may become impractical and/or inefficient to perform accurate, realistic illumination modeling in a real-time context. For the example use case of visualization in building renovation, the real-time, interactive operations may entail switching among product options, such as roofing shingles or siding, where the desired response on the interactive display is relatively rapid, and each successive graphic rendering appears realistic and natural. In the context of illumination, realistic and natural refers at least to the accurate and realistic reproduction of surface texture, reflectivity, shadowing, gloss, flatness, and color texture. How these and other characteristics appear in a rendered image depends not only on the illumination model applied, but also where the surface-finishing products or elements are located on the 3D model of the building structure from which the rendered image is created, as well as the surrounding environment of the objects being rendered.

In accordance with example embodiments, the impediment to real-time display and manipulation of rendered images due to the computational costs of realistic illumination may be largely eliminated by pre-computing illumination for various, select rendered surface elements, and storing the surface elements with their pre-computed illumination characteristics for subsequent real-time access and display. More particularly, digital images of surface-finishing elements, such as roofing shingles or siding, may be virtually installed on a 3D model of a building structure, from which illumination characteristics may be pre-computed on a computing device, such as a server. Subsequently, a rendered image of the building structure may be displayed in real-time on a display device that downloads the pre-computed illumination characteristics for the surface-finishing elements. Using the illumination characteristics, the display device may thus enable the rendered image to be displayed and interactively manipulated (e.g., rotated) in real-time with realistic and natural appearing illumination of its surfaces.

As used here, the term "illumination characteristics" refers to various factors that either cause an object to be illuminated in some manner or fashion, or are descriptive of an objects appearance as a result of how it is illuminated. For example, a source of light may be considered an illumination characteristic that causes an object to be illuminated according to properties of the source and its geometric relation to the object. As another example, a source of shadow (e.g., an overhanging roof) may be considered an illumination characteristic that causes an object to be darker or lighter in some locations. As yet another example, physical properties of an object, such as texture or albedo, may be considered an illumination characteristic that causes an object's surface to respond to incident light, and thus affect the appearance of the object. In the present disclosure, these and other types of factors are collectively referred to as illumination characteristics.

In accordance with example embodiments, pre-computed illumination characteristics capture aspects of illumination of rendered surface elements that are both computationally complex and may be subsequently adjusted or adapted with low computational complexity in order to customize appearance in real-time. For example, pre-computed illumination characteristics for a given surface element may account for multiple light sources, multiple light paths, multiple reflections, sources of shadows, reflective properties of the given surface element, as well as other factors that affect how illumination of the given surface element appears at each of multiple locations on the 3D model and from each viewing orientation. Non-limiting examples of subsequent adjustment during viewing may include color selection and viewing orientation of the 3D model. The real-time adjustments may thus share a common set of illumination characteristics, allowing the 3D model to change appearance in real-time, responsive to user interaction (such as color selection), while retaining realistic rendered illumination as real-time adjustments are made.

Illumination characteristics can also contain relative contributions of different light interactions. In the context of a building structure, for example, the illumination in a soffit can be separated in a contribution from a wall and a contribution from all other possible paths. This may allow real-time color adjustment of the soffit in response to a color selected for a different surface element, such as siding. In an example embodiment, such illumination characteristics make take the form of Light Path Expressions (LPE) or Arbitrary Output Variables (AOV).

Figure 4:
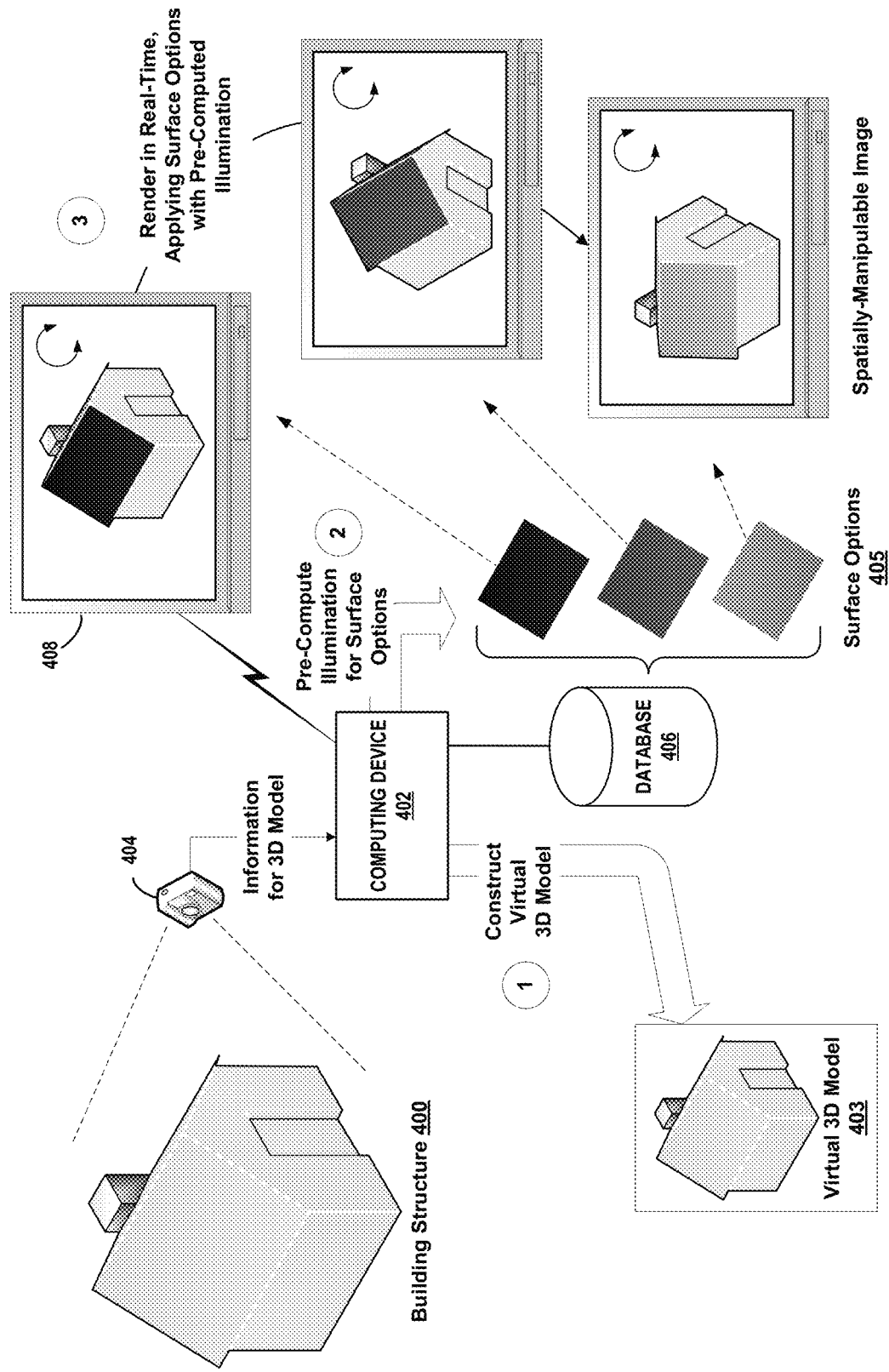
FIG. 4 is a conceptual illustration of real-time visualization of a building structure, in accordance with example embodiments.

FIG. 4 is a conceptual illustration of real-time visualization of a building structure, in accordance with example embodiments. As represented in the figure, a computing device 402 generates a virtual 3D model 403 of an actual building structure 400, based on information descriptive of the building structure 400 supplied to the computing device 402. For purposes of the discussion, this operation is labeled with a "I" in a circle at the left side of FIG. 4. The computing device 402 could be a server in "the cloud," for example.

The information descriptive of the building structure 400 could be photographic images obtained by a camera device 404, also shown in FIG. 4. Other forms and sources of information are possible as well. For example, photographic images obtained from an aerial vehicle, such as drone or the like, could be analyzed and a 3D model of the exterior of the building structure create from the analyzed images. Other non-limiting examples of information sources include LIDAR, time-of-flight cameras, stereo cameras, and 3D scanners. Additionally or alternatively, architectural information, such as blue prints, could be used to generate the virtual 3D model. The model could be constructed by an application running on the computing device 402, such as a computer aided design (CAD) program or the like.

A database 406 may contain digital (e.g., photographic) and rendered images of various surface-finishing elements or products, such as shingles and siding. As noted above, surface-finishing elements may include other types of externally-viewable components, such as windows, trim, and building extensions, to name a few. These are referred to as surface options 405 in FIG. 4 in view of their role in the building renovation and construction use case. By way of example, the surface options are taken to be roof-finishing elements, and are represented for purposes of the discussion by just three different shades of gray. In the simplified, conceptual example of FIG. 4, the surface options 405 may appear as an entire roof. However, in practice, each surface option may actually represent just a sample product, such as a single roofing shingle or a single sheet of roofing shingles.

In accordance with example embodiments, the computing device 402 may pre-compute illumination characteristics for each of the surface options 405, and store the pre-computed results with the surface options 405 in the database 406. For purposes of the discussion, this operation is labeled with a "2" in a circle near the center of FIG. 4. The pre-computation may utilize a detailed illumination model, and account for not only characteristics of the surface options, such as color and/or texture, but also where on the virtual 3D model of the building each surface option is placed on the virtual 3D model of the building. For the example of roofing shingles, distinct virtual shingles or sheets of shingles of a given option (e.g., style, color, etc.) may be layered in simulation at various locations on or across the virtual roof. Pre-computation of illumination may then associate illumination characteristics for the given shingle option for each location on the virtual roof. Further aspects of pre-computing illumination characteristics are described below. This operation could be repeated for multiple different shingle options, and associated data stored with each option.

Carrying out the pre-computation operation offline and/or remotely from a display operation allows the potentially complicated and computationally expensive to be separated from the display operation. Yet, at the same time, the detailed illumination characteristics of each roofing (or other surface-finishing) option may be made available (e.g., stored in the database 406) for the display operation, thereby enabling real-time display of and interaction with a rendered image having surface-finishing elements that appear naturally illuminated.

The interactive display is illustrated conceptually as a real-time rendering operation, labeled with a "3" in a circle at the right side of FIG. 4. Three examples of a display device 408 are represented, each depicting a rendering of the building structure 400 with one of the surface options 405. As a visual cue for the ability to spatially manipulate the rendered images, each of the depictions has a different apparent orientation in the display. For example, each instance of the display device 408 could represent an end user making a new selection for one of the surface options 405. In accordance with example embodiments, each selection may cause the display device 408 to generate in real-time a new version of a virtual image of the building structure 400. By way of example, "real-time" may refer to interactive response time of 0.5 seconds or less. For example, the time between a user selection on the display device and the generation of the corresponding image in the display device may be considered real-time if the delay is 0.5 seconds or less. Other criteria for "real-time" could be used as well. Each generated image may then use the pre-computed illumination characteristics for the selected roofing option, and thus bypass a potential need to carry out the computationally expensive operations of realistic illumination modeling. Advantageously, the display device 408 may thus provide the end user (e.g., home owner) with a smooth and seamless viewing experience, and yet provide realistic and believable graphical results.

Non-limiting examples of illumination characteristics that may be pre-computed include: intensity of reflected illumination, intensity of ambient illumination, intensity and direction of direct illumination, angular distribution of illumination, shadow map, and hemispherical illuminance according to the surface normal of the surface element. As noted above, illumination characteristics may including mapping that associates the characteristics not only to a particular surface element, but to virtual location on the 3D model and viewing orientation. In an example embodiment, mapping may be implemented by virtual links between illumination and map coordinates. It will be appreciated that while the example conceptual illustration of FIG. 4 is descriptive of procedure applied to roofing surfaces, the techniques could be applied to other surface-finishing elements or products as well. Non-limiting examples of surface-finishing elements include: roofing shingles, roofing tiles, roof-finishing membranes, all or sections of exterior-wall siding, all or sections of exterior-wall cladding, exterior-wall bricks, exterior-wall stones, stucco, windows, doors, exterior-wall trim, exterior-wall window trim, soffits, all or sections of a rain gutter, and all or sections of a rain downspout.

In accordance with example embodiments, pre-computation of illumination may entail computing illumination of the sky and sun on building structure with one or more surface-finishing elements virtually installed or applied. This may also capture shadow characteristics in addition to surface reflections and/or absorptions of light. In particular, two scales need to be considered: building-size scale (or large scale) and product-size (e.g. roofing shingle) scale (or small scale). Both scales are accounted for in example techniques.

The building structure may be considered to include various segments or structural components. Examples include walls, roof, doors, and windows. Each of these elements may be characterized in terms of texture coordinates. In accordance with example embodiments, the texture components may be computing coordinates for each polygon with a given scale, and then using an illumination algorithm that yields uniform surface density in the texture coordinates. Then light and texture, among other illumination characteristics, are stored with each element or surface product in the database 406.

In an example embodiment, direct illumination by the sun may be omitted from the pre-computation operation. Direct and soft shadows may then be generated by the real-time display component. This approach may support an optimization of computations in which certain illumination characteristics, such as shadows, can divided into a pre-computation part and a real-time part, carried out in a display device. For example, direct shadows from the sun need a high resolution and require large data transfers from a remote database to a display device. However, they are also relatively easy to calculate in real-time, so pre-computation is not necessarily an advantage.

In accordance with example embodiments, various illumination models may be used in the pre-computation. Such models may incorporate detailed light-path propagation, including multiple reflections, as well as absorptions and spectral descriptions of colors and light interactions. In an example embodiment, detailed light propagation and reflections may be computed using Monte-Carlo simulations or other statistical techniques. Additionally or alternatively, biased or unbiased rendering techniques may be used. Light sources may be diffuse or ambient light from the sky, as well as direct light from the sun. The pre-computations may then be applied to the various surfaces of the virtual 3D model of the building structure to determine the illumination characteristics of different surface components at different size scales and viewing orientations.

In further accordance with example embodiments, real geometry of the surface-finishing elements in the pre-computation may be applied in conjunction with perspective mimicking techniques, such as parallax mapping, relief mapping, parallax occlusion mapping, and cone step mapping in the real time device. In this technique, surface-finishing element information stored in the database may be used describe the shape and the pre-computed illumination characteristics calculated on the real geometry. This enables an accurate and computationally expensive description of the surface-finishing element to be used in the pre-computation, but a simpler one to be used in the real time. For example a flat surface may be used as the receiver of illumination information. In an example of how this may be applied, mathematical construction of real geometry to generate size and shape may be replaced (at least in part) by techniques that mimic perspective by adjusting how illumination characteristics are mapped on a surface using both a description of the shape of a surface element and the relative position of a viewing point.

Simulated Photographic Rendering of Images for Merging with Real Photographic Images.

Merging a rendered image with a photographic image in a way the yields a realistic or natural result entails two main aspects. The first is rendering an image or an object with illumination that is as close as possible to that in the photographic image. The second aspect is to merge or superimpose the rendered object in the photographic image so that it integrates naturally with the background and/or environment of the photographic image. For the example use case of home renovation, the first aspect may involve creating a virtual 3D model of a home (or building structure), virtually installing a surface-finishing element, such as a new roof, and simulating photographic capture of the model with simulated properties and conditions matching those of the photographic image. The second aspect may involve determining appropriate or correct relative placement of the rendered object and real objects (e.g., trees, landscaping) of the photographic image.

Figure 5:
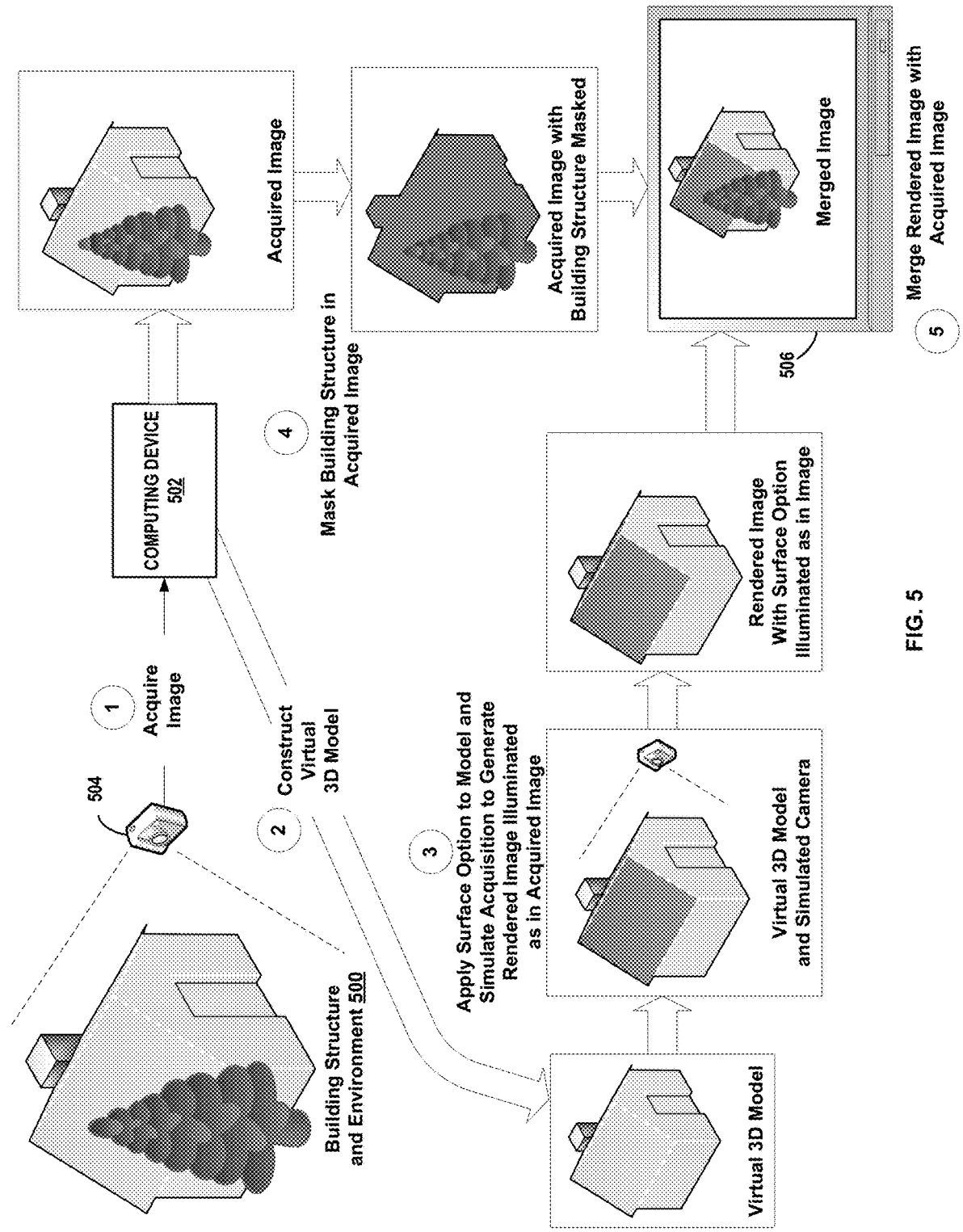
FIG. 5 is a conceptual illustration of visualization of a building structure and its environment, in accordance with example embodiments.

FIG. 5 a conceptual illustration of visualization of a building structure and its environment, in accordance with example embodiments. As represented in the figure, a camera device 504 acquires an image of a building structure and its environment 500, represented in this example illustration by a single house and a single tree, and provides the image to a computing device 502. For purposes of the discussion, this operation is labeled with a "1" in a circle in FIG. 5. In an example embodiment, the camera device 504 may be a digital camera. Further, the camera device 504 may acquire more than one image. Additionally or alternatively, the camera device 504 could be or include a video device, and the image data acquired could be video data. However, there is no loss in generality by considering just a single acquired image.

The computing device 502 may also generate a complete or partial virtual 3D model of an actual building structure and environment 500, based on information descriptive of the building structure 500 supplied to the computing device 502. For purposes of the discussion, this operation is labeled with a "2" in FIG. 5. As with the example if FIG. 4, the information descriptive of the building structure 500 could come from various sources, including the camera device 504.

The computing device 502 may next simulate installation of a surface option (e.g., a surface-finishing element or product) on the virtual 3D model, and then simulate acquisition of a virtual photograph of the 3D model. In the example of FIG. 5, this is represented by application of a new (darker) roof, and labeled with a "3." In accordance with example embodiments, the simulation of the virtual photograph entails determining the actual position and perspective of the camera device 504 when the acquired image was acquired. As described below, this may involve solving a camera equation and/or analyzing other information indicative of the relative geometry of the camera device 504 and the building structure 500 when the photograph was acquired. For example, building elements of the 3D model could be matched to their appearance in the rendered image. Simulation of the virtual photograph may further entail simulating the response of the camera device 504 and the actual, natural illumination of the building structure 500 when the photograph was acquired.

The resulting rendered image of the 3D model with the surface option installed serves as sort of synthetic photograph of what the actual building structure 500 with the actual surface option installed would look like in an actual photograph if photographed with the camera device 504 at its position and orientation with respect to the building structure 500, and under the same lighting conditions, as when the acquired image was acquired. Further explanation of how this may be achieved is discussed below.

In preparation for merging the rendered image with the acquired photographic image, the building structure 500 is masked out of the acquired image. In some example operations, it may be appropriate or desirable to mask out only a portion of the building structure, such as a portion that is under renovation. For the present illustration, the entire building structure is considered as being masked out; there is no loss in generality in doing so for illustrative purposes. In accordance with example embodiments, the masking operation, labeled with a "4" in FIG. 5, entails identifying which pixels of the acquired image will be replaced (or at least partially replaced) by a digitized version of the simulated image, and which pixels will remain unaltered. This operation is depicted in FIG. 4 by a grayed-out outline of the building structure with the photographed tree in the foreground. In this example, the gray-out outline represents the mask, which contains pixels that will be replaced by the rendered image; the tree contains pixels that will not be replaced in the merged image. In some examples, some pixels of a masked region may be left instead of replaced in order to create a more natural appearance at the boundary between the mask and the image pixels. Further explanation of how the masking is achieved is discussed below.

Finally, the rendered image of the building structure with the surface option applied is merged with the acquired photographic image in a display device 506. In accordance with example embodiments, the merging is accomplished by rasterizing the rendered image such that it is composed of pixels, and then replacing the pixels in the masked portion of the photographic image with the pixels of the rasterized, rendered image. Note that the pixel replacement may be one-to-one if the pixel resolution of the rasterized, rendered image matches that of the acquired photograph. If the pixel resolution of the two images does not match, then a conversion or mapping may be performed to determine how pixels of the photographic image may be replaced by those of the rendered image.

Generating a merged image as described above may thus yields the rendered image with the surface option applied and appearing in the photographic image, and appearing as if it were photographed with the camera device 504 under the same conditions as the actual acquired photograph.

Simulated photographic imaging of the virtual 3D model may be referred to herein as "matched rendering." This term is descriptive of the process of rendering an image of an object to match an actual photographic image of the object. In accordance with example embodiments, matched rendering involves determining factors and circumstances of the actual photographic image(s), and rendering an image that effectively simulates the actual image capture. This allows the rendered object to appear natural in merged with the photographic image. For purposes of the present discussion, the factors and circumstances of the actual image are referred to herein as "acquisitional circumstances." As such, "matching" may be applied to the acquistional circumstances; that is, the acquisitional circumstances are matched in simulation in the rendering process. Non-limiting examples include camera perspective and position, camera orientation with respect to the real object (e.g., building structure) weather, camera exposure, white balance, lens deformation, vignetting, and tone mapping, shadows, and noise and resolution properties of the camera that acquired the photo.

The camera position and perspective may be determined in various ways. For example, having a global navigation satellite system (GNSS), such as a global positioning satellite (GPS), position may allow determination of the relative position of the camera and the building structure. Apparent shapes and sizes of surface elements having known shapes and sizes may be used to determine the perspective or orientation. This could involve solving geometric and/or trigonometric equations, for example.

Weather conditions may be used in an illumination model to match the illumination of the matched render with that of the actual photographic image. In accordance with example embodiments, weather conditions present at the time and location at which the photographic image was acquired may be reconstructed or inferred from time, data, and position information, together with historical weather records and astronomical ephemeris data (e.g., position of the sun). Weather conditions may further be obtained by reconstructing 3D geometry from camera pointing direction and location. The sun position relative to the camera can be then estimated, as well as the cloud coverage from weather databases, using time and location information. In addition, this image information may serve as input to a machine learning system, such as a neural network, to determine weather conditions as recognized by machine learning processing.

In accordance with example embodiments, the actual rendering may then entail reconstructing the sky illumination conditions of the acquisitional circumstances. The output may include a high definition image and/or a low definition image, as well as a mask of what was rendered. In the above operational example of FIG. 5, the mask is an outline of the building structure (house) minus the tree, which remains part of the original acquired photograph. The output image may then be completed by tone mapping, or by techniques for mimicking camera response as lens deformation, for example. In addition, vignetting may be used to match the virtual (simulated) camera to the real camera, or to compensate defects of the real camera. This operation helps match illumination characteristics.

In accordance with example embodiments, the masking operation may involve initially a rough estimate of a mask followed by refinement. The masking operations could be automatic, possibly augmented by manual interaction of a user, for example. Example techniques for the rough estimate include using a fully-connected neural network or other machine learning techniques to segment or classify the actual image according to one of three categories. These are: "building," "not building," and "uncertain." Refinement may be accomplished using a matting technique. In an example embodiment, a convolutional neural network (CNN) may be applied to the image. Such a technique may be used to recognize patterns and structures on multiple different size scales.

In accordance with example embodiments, matting techniques may be used to adjust the masking operation at the edge to provide a more visually appealing result. More particularly, machine learning techniques may require a decrease in resolution for segmenting. Matting may compensate for the decreased resolution.

Example Methods

Example embodiments disclosed herein may include computing systems and/or devices and methods carried out by the computing systems and/or devices. Example computing systems and/or devices, such as computing system 100, client device 112, and database 114, shown in FIG. 1, and display device 200, shown in FIG. 2, may include one or more special and/or general purpose processes, volatile and non-volatile storage, including non-transient machine readable media, such as magnetic disk, solid state memory, among others. Systems may also include a user interface, including interactive input devices, such as keyboards, and display devices and graphical user interfaces (GUIs).

Example methods may be implemented as machine language instructions stored one or another forms of the system storage, and accessible by the one or more processors, and that, when executed by the one or more processors cause the system and/or device to carry out the various operations and functions of the methods described herein.

Figure 6:
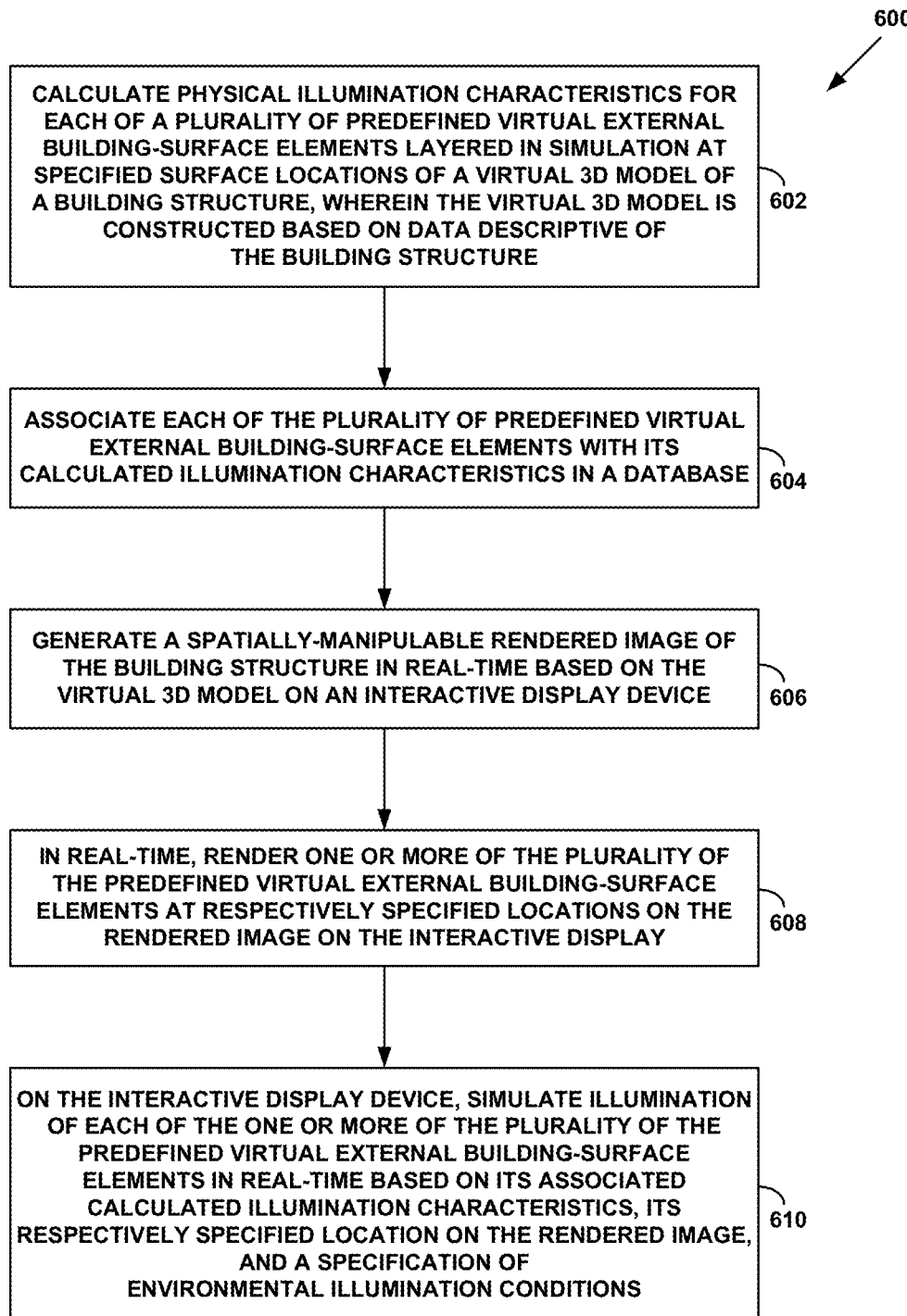
FIG. 6 is a flow chart of an example method of real-time visualization of a building structure, in accordance with example embodiments.

FIG. 6 is a flow chart illustrating an example embodiment of a method 600 for illumination in rendered images used in real-time visualizations. The blocks represented in the flow chart may be carried by a computing device, such as computing system 100, and a display device, such as display device 200.

The embodiments of FIG. 6 may be simplified by the removal of any one or more of the features shown therein. Further, these embodiments may be combined with features, aspects, and/or implementations of any of the previous figures or otherwise described herein.

At block 602, the computing device may calculate physical illumination characteristics for each of a plurality of predefined virtual external building-surface elements layered in simulation at specified surface locations of a virtual three-dimensional (3D) model of a building structure. By way of example, the plurality of predefined virtual external building-surface elements could be virtual representations (e.g., renderings) of all or a subset of a collection of building products available from one or more manufactures. For instance, the plurality could contain virtual representations of all or some of a collection of product lines of roofing shingles from a manufacturer. Additional or alternative types of products could be included as well (such as those listed above). In accordance with example embodiments, the virtual 3D model may be constructed based on data descriptive of the building structure. Simulated layering of building-surface elements on the 3D model may be consider a sort of computational analog of virtual installation of a rendered building product on a 3D virtual model. As such, virtual installation may follow the same (or similar) element-specific installation rules in simulation as the corresponding actual product would in real installation. The building structure could correspond to all or just a portion of an actual building structure at a given location. Further, the building structure could correspond to all or just a portion of a planned building structure at the given location.

At block 604, each of the plurality of predefined virtual external building-surface elements may be associated with its calculated illumination characteristics in a database, such as database 112. In accordance with example embodiments, each of the plurality of predefined virtual external building-surface elements could be a digital-image representation of a respective surface-finishing component, such as a photographic image, or a rendered graphical image.

At block 606, a spatially-manipulable rendered image of the building structure may be generated on an interactive display device in real-time, based on the virtual 3D model.

At block 608, one or more of the plurality of the predefined virtual external building-surface elements is rendered in real-time at respectively specified locations on the rendered image on the interactive display device. For example, one or more roofing shingles may be rendered on all or a portion of the roof of a rendered 3D building structure.

Finally, at block 610, illumination may be simulated in real-time on the interactive display device for each of the one or more of the plurality of the predefined virtual external building-surface elements at their rendered positions. The simulation may be based on each predefined surface element's associated calculated illumination characteristics, its respectively specified location on the rendered image, and a specification of environmental illumination conditions.

In an example embodiment, the operations of blocks 608 and 610 can be considered as displaying a rendering of the 3D model of the building structure, including rendering of the one or more virtual external building-surface elements, and then using the illumination characteristics of the one or more virtual external building-surface elements to adjust the rendered appearance of the building-surface elements in real-time. In this approach, each location on the rendered 3D building structure may be thought of as having a virtual link or pointer to "rendering instructions" that determine what form or type of surface to render and how to render it (e.g., illumination). The rendering instructions include the pre-computed illumination characteristics that enable the instructions to be carried out in real-time. That is, computationally-intensive aspects of the rendering are performed ahead of time, thereby allowing the display device to adjust the rendering of the 3D model and the surface elements in real-time response to interactive input, such as rotating the displayed building structure, changing the simulated viewing perspective, and changing the simulated lighting environment of the displayed image.

In accordance with example embodiments, the respective surface-finishing component could be a construction product. None limiting example include: a roofing shingle, a roofing tile, a section of roof-finishing membrane, a section of exterior-wall siding, a section of exterior-wall cladding, an exterior-wall brick, an exterior-wall stone, a window, an exterior-wall trim, an exterior-wall window trim, a soffit element, a section of rain gutter, or a section of rain downspout. Other examples of surface-finishing elements, such as, but not limited to, examples listed or described elsewhere herein may also be included.

In accordance with example embodiments, rendering, in real-time, the one or more of the plurality of the predefined virtual external building-surface elements at respectively specified locations on the rendered image may entail rendering a size and shape of each of the one or more of the plurality of the predefined virtual external building-surface elements based on the respectively specified location and a simulated viewing location with respect to the rendered image. For example, a roofing shingle may have a fixed actual size and shape, but its apparent size and shape in a rendered image will depend on its location on the roof of a virtual 3D model and the perspective and location from which it is view. Accordingly, rendering in real-time accounts for translating the actual size and shape to an apparent size and shape.

Also in accordance with example embodiments, simulating illumination of each of the one or more of the plurality of the predefined virtual external building-surface elements in real-time may entail rendering each of the one or more of the plurality of the predefined virtual external building-surface elements according to a specified color and/or a specified texture map. In particular, building-surface elements may be rendered with color and/or texture such that they appear realistically illuminated. Further, for each respective one of the one or more of the plurality of the predefined virtual external building-surface elements, the physical appearance of the may be rendered at its respectively specified location on the rendered image, subject to its associated illumination characteristics and specified illumination conditions at the given location. That is the rendering of each building-surface element may account for specific illumination of the virtual surface element at its location on the building. The rendering of each building-surface element may also entail a "procedural description" of its appearance. This may use illumination characteristics to simulate how an image would be acquired, such as camera position and/or settings, and incorporate these factors into the rendering.

In accordance with example embodiments, the data descriptive of the building structure may include any one or more of: one or more photographic images of the building structure, architectural data descriptive of the building structure, laser scans, 3D scans, stereoscopic photography, or data descriptive of environmental surroundings of the building structure.

In accordance with example embodiments, calculating the physical illumination characteristics for each of the plurality of predefined virtual external building-surface elements layered in simulation at specified surface locations of the virtual 3D model may entail computing the physical illumination characteristics using a physical illumination model applied at each of the specified surface locations of the virtual 3D model. In particular, this may entail incorporating physical characteristics of each of the plurality of predefined virtual external building-surface elements plurality of predefined virtual external building-surface elements into the illumination model. Non-limiting examples of physical characteristics include a shape, a surface pattern, gloss, refractive index, or albedo. Non-limiting examples of surface pattern could include an embossment on siding (e.g., simulated wood grain) granulation on roofing shingles, surface normal, and metallic reflection.

In accordance with example embodiments, the computing device on which the the physical illumination characteristics are computed may be remote from the interactive display device. For example, they may be connected by a network. Further, the database on which the the plurality of predefined virtual external building-surface elements are stored with their respective, calculated illumination characteristics may also be remotely connected with the interactive display device via a data communications network.

In accordance with example embodiments, the physical illumination characteristics may include: intensity of reflected illumination, intensity of ambient illumination, intensity and direction of direct illumination, angular distribution of illumination, shadow map and/or distribution, and texture coordinates. These are non-limiting examples of physical illumination characteristics.

In further accordance with example embodiments, the example method may further entail receiving interactive input data at the interactive display device, in real-time, specifying various selection criteria. Non-limiting examples of such selection criteria may include: a subset of the plurality of predefined virtual external building-surface elements identifying the one or more of the plurality of the predefined virtual external building-surface elements, the specification of environmental illumination conditions at the given location, or a rendering color of the one or more of the plurality of the predefined virtual external building-surface elements. That is, an end user may interactively specify surface products and colors, as well as illumination conditions.

Figure 7:
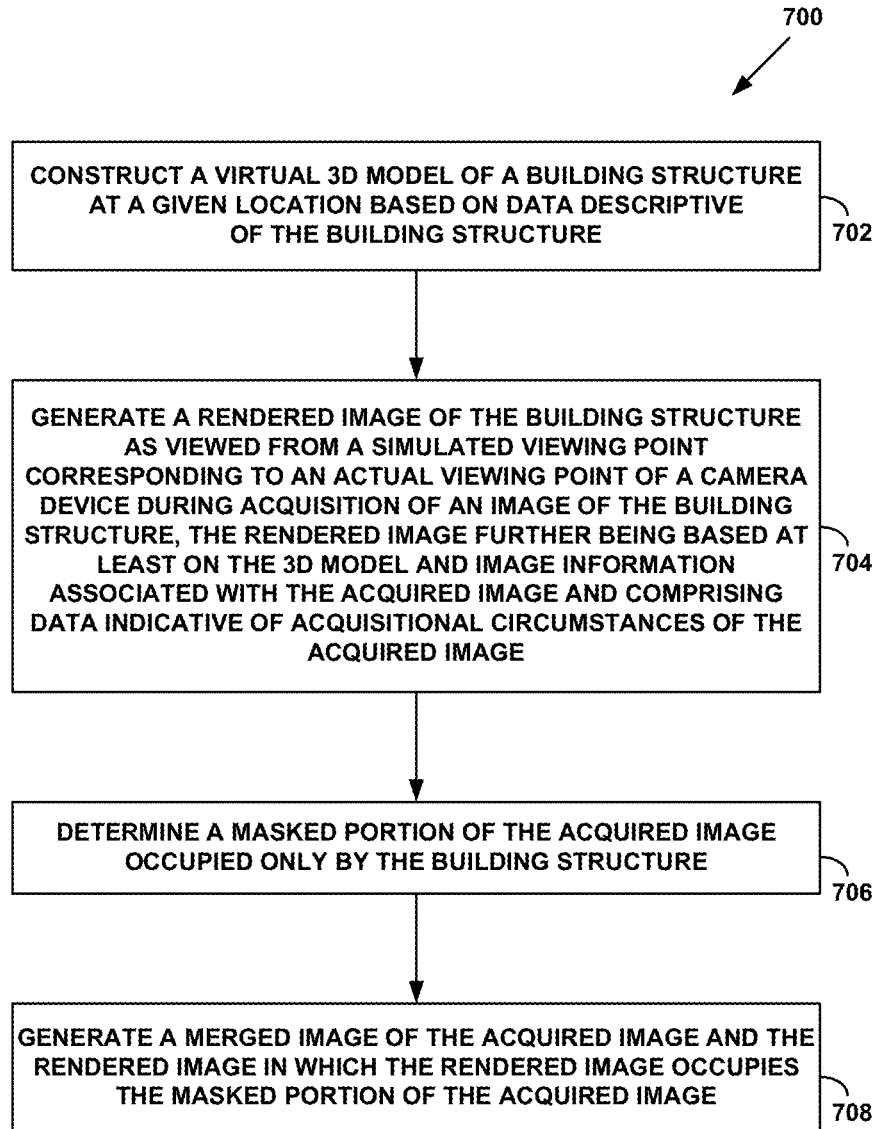
FIG. 7 is a flow chart of an example method of visualization of a building structure and its environment, in accordance with example embodiments.

FIG. 7 is next a flow chart illustrating an example embodiment of a method 700 for simulated photographic rendering of images for merging with real photographic images. The blocks represented in the flow chart may be carried by a computing device, such as computing system 100, and a display device, such as display device 200.

The embodiments of FIG. 7 may be simplified by the removal of any one or more of the features shown therein. Further, these embodiments may be combined with features, aspects, and/or implementations of any of the previous figures or otherwise described herein.

At block 702, the computing device may construct a virtual three-dimensional (3D) model of a building structure at a given location based on data descriptive of the building structure. In accordance with example embodiments, the building structure may be an entire actual building structure at the given location, or a building portion of the entire building structure at the given location. Further the data descriptive of the building structure may include one or more photographic images of the building structure and it environmental surroundings, architectural data descriptive of the building structure, or data descriptive of environmental surroundings of the building structure.

At block 704, the computing device may generate a rendered image of the building structure as viewed from a simulated viewing point corresponding to an actual viewing point of a camera device during acquisition of an image of the building structure. In particular, the rendered image may further be based at least on the 3D model together with image information associated with the acquired image. The image information may include data indicative of acquisitional circumstances of the acquired image. In particular, acquisitional circumstances may be used to describe the circumstance under which the image was acquired. Non-limiting examples of acquisitional circumstances may include: geographic location of the camera device when the acquired image was acquired, position and perspective of the camera device with respect to the building structure when the acquired image was acquired, a timestamp of when the acquired image was acquired, weather conditions at the given location when the acquired image was acquired, position of sun in the sky at the given location when the acquired image was acquired, illumination conditions at the given location when the acquired image was acquired, response characteristics of the camera device, or operational settings of the camera device when the acquired image was acquired.

At block 706, the computing device may determine a masked portion of the acquired image occupied only by the building structure.

Finally, at block 708, merged image of the acquired image and the rendered image may be generated on a display device. More specifically, in the merged image may be constructed so that the rendered image occupies the masked portion of the acquired image.

In accordance with example embodiments, the rendered image of the building structure may be characterized (at least in part) by an apparent size and perspective relative to the simulated viewing point that matches that of the building structure in the acquired image relative to the actual viewing point. In an example, generating the rendered image of the building structure as viewed from the simulated viewing point corresponding to the actual viewing point may entail determining the simulated viewing point from the stored image information.

More specifically, generating the rendered image of the building structure as viewed from the simulated viewing point may entail solving a camera equation to determine a virtual position, orientation, and field of view of a simulated camera with respect to the rendered image of the building structure that match an actual position, orientation, and field of view of the camera device with respect to the building structure. With these properties determined, simulated image capture of the building structure by the simulated camera may be performed by simulated response characteristics matching response characteristics of the camera device when the acquired image was acquired.

Another way of characterizing generating the rendered image of the building structure is by determining a position and perspective of the camera device with respect to the building structure when the acquired image was acquired, and then generating the rendered image of the building structure as viewed from a rendering perspective that matches the determined position and perspective of the camera device with respect to the building structure. In both the actual image acquisition and the simulated image capture with the virtual camera device, "perspective of the camera device with respect to the building structure" may be taken to mean orientation and field of view of the camera device (virtual or real) with respect to the build structure in its environment (virtual 3D model or real).

In accordance with example embodiments, determining the position and perspective of the camera device with respect to the building structure may entail determining the position and perspective of the camera device based on the actual viewing point and the given location of the building structure. More particularly, an apparent size and shape on the acquired image of the building structure of an element having a known size and shape may first be determined. Then, the position and perspective of the camera device may be determined such that the apparent size and shape of the element is reproduced from the known size and shape of the element as viewed from the geometrically determined position and perspective. For example, due to the actual camera's position and perspective, a window of known size and shape (e.g., rectangular) may be observed in the acquired image to be trapezoidal with apparent side lengths. The position and perspective of the actual camera may then be geometrically determined such that the known size and shape of the window is transformed to match its apparent size and shape in the acquired image.

In an example embodiment, position and perspective can be recovered using structure from motion with surrounding images or image optimization techniques, using an initial guess of the positon (e.g. GNNS/GPS) and refining it to minimize the differences in perspective between the virtual camera and the original pictures. The differences can be computed using distance of markers in the 3D model and 2D images at various locations of the buildings (corners, edges, of building or building elements).

In accordance with example embodiments, determining the position and perspective of the camera device with respect to the building structure may further entail determining the geographic location of the camera device when the acquired image was acquired.

Also in accordance with example embodiments, generating the rendered image of the building structure as viewed from the simulated viewing point corresponding to the actual viewing point may entail generating the rendered image with illumination characteristics matching those of the physical environment at the given location when the acquired image was acquired. Accordingly, generating the rendered image of the building structure may entail determining the illumination characteristics of the physical environment at the given location when the acquired image was acquired. For example, acquisitional circumstances such as weather conditions, time of day, and position of the sun when the acquired image was acquired may be used to in illumination model applied in the rendering operation.

In accordance with example embodiments, generating the rendered image of the building structure may also entail simulating application of one or more virtual surface-finishing components on the rendered image of the building structure, and then simulating illumination of the rendered image, including the one or more surface-finishing elements, to match illumination of the physical environment at the given location when the acquired image was acquired. In this way, the build structure and the virtual finishing components may be rendered with illumination characteristics as they would have been if the actual camera had captured the image.

In accordance with example embodiments, each of the one or more virtual surface-finishing components could be a building product. Non-limiting examples of such building products include: a virtual roofing shingle, a virtual roofing tile, a virtual section of roof-finishing membrane, a virtual section of exterior-wall siding, a virtual section of exterior-wall cladding, a virtual exterior-wall brick, a virtual exterior-wall stone, a virtual window, a virtual exterior-wall trim, a virtual exterior-wall window trim, a virtual soffit element, a virtual section of rain gutter, or a virtual section of rain downspout.

In accordance with example embodiments, determining a masked portion of the acquired image occupied only by the building structure may entail classifying pixels of the acquired image as being one of part of the building structure, or not part of the building structure, and then identifying the masked portion as being those pixels classified as part of the building structure. More specifically, classifying the pixels of the acquired image as being one of part of the building structure, or not part of the building structure may entail applying image segmentation to classify the pixels of the acquired image as being one of part of the building structure, not part of the building structure, or uncertain, and then applying matting to resolve uncertainty in the image segmentation classification.

In accordance with example embodiments, generating a merged image of the acquired image and the rendered image may then entail replacing pixels within the masked portion of the acquired image with a rasterized version of the rendered image.

Enumerated Embodiments

Additional aspects of the disclosure are provided by the following enumerated embodiments, which can be combined in any number and in any fashion that is not technically or logically inconsistent.

1. A method for real-time visualization of building structures, the method comprising:
    calculating physical illumination characteristics for each of a plurality of predefined virtual external building-surface elements layered in simulation at specified surface locations of a virtual three-dimensional (3D) model of a building structure, wherein the virtual 3D model is constructed based on data descriptive of the building structure;
    associating each of the plurality of predefined virtual external building-surface elements with its calculated illumination characteristics in a database;
    on an interactive display device, generating a spatially-manipulable rendered image of the building structure in real-time based on the virtual 3D model;
    on the interactive display device, rendering, in real-time, one or more of the plurality of the predefined virtual external building-surface elements at respectively specified locations on the rendered image; and
    on the interactive display device, simulating illumination of each of the one or more of the plurality of the predefined virtual external building-surface elements in real-time based on its associated calculated illumination characteristics, its respectively specified location on the rendered image, and a specification of environmental illumination conditions.

2. The method of embodiment 1, wherein the building structure is at least one of: at least a portion of an actual building structure at a given location, or at least a portion of a planned building structure at the given location.

3. The method of either of embodiments 1 or 2, wherein each of the plurality of predefined virtual external building-surface elements comprises a digital-image representation of a respective surface-finishing component, the digital image representation being at least one of: a photographic image, or a rendered graphical image.

4. The method of any of the preceding embodiments, wherein the respective surface-finishing component is one of: a roofing shingle, a roofing tile, a section of roof-finishing membrane, a section of exterior-wall siding, a section of exterior-wall cladding, an exterior-wall brick, an exterior-wall stone, a window, an exterior-wall trim, an exterior-wall window trim, a soffit element, a section of rain gutter, or a section of rain downspout.

5. The method of any of the preceding embodiments, wherein rendering, in real-time, the one or more of the plurality of the predefined virtual external building-surface elements at respectively specified locations on the rendered image comprises:
   rendering a size and shape of each of the one or more of the plurality of the predefined virtual external building-surface elements based on the respectively specified location and a simulated viewing location with respect to the rendered image.

6. The method of any of the preceding embodiments, wherein simulating illumination of each of the one or more of the plurality of the predefined virtual external building-surface elements in real-time comprises:
   rendering each of the one or more of the plurality of the predefined virtual external building-surface elements with at least one of: a specified color, or a specified texture map.

7. The method of any of the preceding embodiments, wherein the data descriptive of the building structure comprise description information, the description information being at least one of: one or more photographic images of the building structure, architectural data descriptive of the building structure, or data descriptive of environmental surroundings of the building structure.

8. The method of any of the preceding embodiments, wherein calculating the physical illumination characteristics for each of the plurality of predefined virtual external building-surface elements layered in simulation at specified surface locations of the virtual 3D model comprises:
   computing the physical illumination characteristics using a physical illumination model applied at each of the specified surface locations of the virtual 3D model.

9. The method of embodiment 8, wherein computing the physical illumination characteristics using the physical illumination model applied at each of the specified surface locations of the virtual 3D model comprises:
   incorporating physical characteristics of each of the plurality of predefined virtual external building-surface elements plurality of predefined virtual external building-surface elements into the illumination model, wherein the physical characteristics are at least one of: a shape, a surface pattern, gloss, refractive index, or albedo.

10. The method of any of the preceding embodiments, wherein calculating the physical illumination characteristics for each of the plurality of predefined virtual external building-surface elements layered in simulation at specified surface locations of the virtual 3D model comprises computing the physical illumination characteristics on a computing device remote from the interactive display device,
   and wherein associating each of the plurality of predefined virtual external building-surface elements with its calculated illumination characteristics in the database comprises storing each of the plurality of predefined virtual external building-surface elements with its associated calculated illumination characteristics in a database remotely connected with the interactive display device via a data communications network.

11. The method of any of the preceding embodiments, wherein physical illumination characteristics comprise: intensity of reflected illumination, intensity of ambient illumination, intensity and direction of direct illumination, angular distribution of illumination, shadow scale, and texture coordinates.

12. The method of any of the preceding embodiments, wherein simulating the illumination of each of the one or more of the plurality of the predefined virtual external building-surface elements in real-time comprises:
   for each respective one of the one or more of the plurality of the predefined virtual external building-surface elements, graphically rendering physical appearance of the respective predefined virtual external building-surface element at its respectively specified location on the rendered image, subject to its associated illumination characteristics and specified illumination conditions at the given location.

13. The method of any of the preceding embodiments, further comprising:
   receiving, in real-time, input data at the interactive display device specifying selection of at least one of: a subset of the plurality of predefined virtual external building-surface elements identifying the one or more of the plurality of the predefined virtual external building-surface elements, the specification of environmental illumination conditions at the given location, or a rendering color of the one or more of the plurality of the predefined virtual external building-surface elements.

14. A system configured for real-time visualization of building structures, the system comprising:
   a computing system including a database; and
   a display device communicatively connected with the computing system,
   wherein the computing system is configured to:
   calculate physical illumination characteristics for each of a plurality of predefined virtual external building-surface elements layered in simulation at specified surface locations of a virtual three-dimensional (3D) model of a building structure, wherein the virtual 3D model is constructed based on data descriptive of the building structure; and
   associate each of the plurality of predefined virtual external building-surface elements with its calculated illumination characteristics in a database, and
   wherein the display device is configured to:
   generate a spatially-manipulable rendered image of the building structure in real-time based on the virtual 3D model;
   render, in real-time, one or more of the plurality of the predefined virtual external building-surface elements at respectively specified locations on the rendered image; and
   simulate illumination of each of the one or more of the plurality of the predefined virtual external building-surface elements in real-time based on its associated calculated illumination characteristics, its respectively specified location on the rendered image, and a specification of environmental illumination conditions.

15. The system of embodiment 14, wherein the building structure is at least one of: at least a portion of an actual building structure at a given location, or at least a portion of a planned building structure at the given location.

16. The system of either of embodiments 14 or 15, wherein each of the plurality of predefined virtual external building-surface elements comprises a digital-image representation of a respective surface-finishing component, the digital image representation being at least one of: a photographic image, or a rendered graphical image.

17. The system of any of the preceding embodiments, wherein the respective surface-finishing component is one of: a roofing shingle, a roofing tile, a section of roof-finishing membrane, a section of exterior-wall siding, a section of exterior-wall cladding, an exterior-wall brick, an exterior-wall stone, a window, an exterior-wall trim, an exterior-wall window trim, a soffit element, a section of rain gutter, or a section of rain downspout.

18. The system of any of the preceding embodiments, wherein rendering, in real-time, the one or more of the plurality of the predefined virtual external building-surface elements at respectively specified locations on the rendered image comprises:
rendering a size and shape of each of the one or more of the plurality of the predefined virtual external building-surface elements based on the respectively specified location and a simulated viewing location with respect to the rendered image.

19. The system of any of the preceding embodiments, wherein simulating illumination of each of the one or more of the plurality of the predefined virtual external building-surface elements in real-time comprises:
rendering each of the one or more of the plurality of the predefined virtual external building-surface elements with at least one of: a specified color, or a specified texture map.

20. The system of any of the preceding embodiments, wherein the data descriptive of the building structure comprise description information, the description information being at least one of: one or more photographic images of the building structure, architectural data descriptive of the building structure, or data descriptive of environmental surroundings of the building structure.

21. The system of any of the preceding embodiments, wherein calculating the physical illumination characteristics for each of the plurality of predefined virtual external building-surface elements layered in simulation at specified surface locations of the virtual 3D model comprises:
computing the physical illumination characteristics using a physical illumination model applied at each of the specified surface locations of the virtual 3D model.

22. The system of embodiment 21, wherein computing the physical illumination characteristics using the physical illumination model applied at each of the specified surface locations of the virtual 3D model comprises:
incorporating physical characteristics of each of the plurality of predefined virtual external building-surface elements plurality of predefined virtual external building-surface elements into the illumination model, wherein the physical characteristics are at least one of: a shape, a surface pattern, gloss, refractive index, or albedo.

23. The system of any of the preceding embodiments, wherein calculating the physical illumination characteristics for each of the plurality of predefined virtual external building-surface elements layered in simulation at specified surface locations of the virtual 3D model comprises computing the physical illumination characteristics on a computing device remote from the interactive display device, and wherein associating each of the plurality of predefined virtual external building-surface elements with its calculated illumination characteristics in the database comprises storing each of the plurality of predefined virtual external building-surface elements with its associated calculated illumination characteristics in a database remotely connected with the interactive display device via a data communications network.

24. The system of any of the preceding embodiments, wherein physical illumination characteristics comprise: intensity of reflected illumination, intensity of ambient illumination, intensity and direction of direct illumination, angular distribution of illumination, shadow scale, and texture coordinates.

25. The system of any of the preceding embodiments, wherein simulating the illumination of each of the one or more of the plurality of the predefined virtual external building-surface elements in real-time comprises:
for each respective one of the one or more of the plurality of the predefined virtual external building-surface elements, graphically rendering physical appearance of the respective predefined virtual external building-surface element at its respectively specified location on the rendered image, subject to its associated illumination characteristics and specified illumination conditions at the given location.

26. The system of any of the preceding embodiments, wherein the system is further configured to:
receive, in real-time, input data at the interactive display device specifying selection of at least one of: a subset of the plurality of predefined virtual external building-surface elements identifying the one or more of the plurality of the predefined virtual external building-surface elements, the specification of environmental illumination conditions at the given location, or a rendering color of the one or more of the plurality of the predefined virtual external building-surface elements.

27. A computing system configured for real-time visualization of building structures, the computing system comprising:
a database;
one or more processors; and
memory storing instructions that, when executed by the one more processors, cause the computing system to carry out operations including:
calculating physical illumination characteristics for each of a plurality of predefined virtual external building-surface elements layered in simulation at specified surface locations of a virtual three-dimensional (3D) model of a building structure, wherein the virtual 3D model is constructed based on data descriptive of the building structure; and associating each of the plurality of predefined virtual external building-surface elements with its calculated illumination characteristics in a database,
wherein the plurality of predefined virtual external building-surface elements and the associated calculated illumination characteristics in the database are configured for a simulation of illumination in an interactive image in an interactive display device, wherein the simulation of illumination comprises:
generating a spatially-manipulable rendered image of the building structure in real-time based on the virtual 3D model;

rendering, in real-time, one or more of the plurality of the predefined virtual external building-surface elements at respectively specified locations on the rendered image; and simulating illumination of each of the one or more of the plurality of the predefined virtual external building-surface elements in real-time based on its associated calculated illumination characteristics, its respectively specified location on the rendered image, and a specification of environmental illumination conditions.

28. The computing system of embodiment 27, wherein the building structure is at least one of: at least a portion of an actual building structure at a given location, or at least a portion of a planned building structure at the given location.

29. The computing system of either of embodiments 27 or 28, wherein each of the plurality of predefined virtual external building-surface elements comprises a digital-image representation of a respective surface-finishing component, the digital image representation being at least one of: a photographic image, or a rendered graphical image.

30. The computing system of any of the preceding embodiments, wherein the respective surface-finishing component is one of: a roofing shingle, a roofing tile, a section of roof-finishing membrane, a section of exterior-wall siding, a section of exterior-wall cladding, an exterior-wall brick, an exterior-wall stone, a window, an exterior-wall trim, an exterior-wall window trim, a soffit element, a section of rain gutter, or a section of rain downspout.

31. The computing system of any of the preceding embodiments, wherein the data descriptive of the building structure comprise description information, the description information being at least one of: one or more photographic images of the building structure, architectural data descriptive of the building structure, or data descriptive of environmental surroundings of the building structure.

32. The computing system of any of the preceding embodiments, wherein calculating the physical illumination characteristics for each of the plurality of predefined virtual external building-surface elements layered in simulation at specified surface locations of the virtual 3D model comprises:
computing the physical illumination characteristics using a physical illumination model applied at each of the specified surface locations of the virtual 3D model.

33. The computing system of embodiment 32, wherein computing the physical illumination characteristics using the physical illumination model applied at each of the specified surface locations of the virtual 3D model comprises:
incorporating physical characteristics of each of the plurality of predefined virtual external building-surface elements plurality of predefined virtual external building-surface elements into the illumination model, wherein the physical characteristics are at least one of: a shape, a surface pattern, gloss, refractive index, or albedo.

34. The computing system of any of the preceding embodiments, wherein calculating the physical illumination characteristics for each of the plurality of predefined virtual external building-surface elements layered in simulation at specified surface locations of the virtual 3D model comprises computing the physical illumination characteristics on a computing device remote from the interactive display device, and wherein associating each of the plurality of predefined virtual external building-surface elements with its calculated illumination characteristics in the database comprises storing each of the plurality of predefined virtual external building-surface elements with its associated calculated illumination characteristics in a database remotely connected with the interactive display device via a data communications network.

35. The computing system of any of the preceding embodiments, wherein physical illumination characteristics comprise: intensity of reflected illumination, intensity of ambient illumination, intensity and direction of direct illumination, angular distribution of illumination, shadow scale, and texture coordinates.

36. A display device configured for real-time visualization of building structures, the display device comprising:
a graphical display component;
one or more processors; and
memory storing instructions that, when executed by the one or more processors, cause the display device to carry out operations including:
retrieving at least a subset of illumination data from a computing system communicatively connected with the display device, wherein the illumination data comprise:
a plurality of predefined virtual external building-surface elements, each associated with respective pre-computed illumination characteristics, wherein the associated pre-computed illumination characteristics for each given predefined virtual external building-surface element of the plurality comprise physical illumination characteristics calculated for the given predefined virtual external building-surface elements as layered in simulation at a specified surface location of a virtual three-dimensional (3D) model of a building structure;
in the graphical display component, generating a spatially-manipulable rendered image of the building structure in real-time based on the virtual 3D model;
in the graphical display component, rendering, in real-time, one or more of the plurality of the predefined virtual external building-surface elements at respectively specified locations on the rendered image; and
in the graphical display component, simulating illumination of each of the one or more of the plurality of the predefined virtual external building-surface elements in real-time based on its associated calculated illumination characteristics, its respectively specified location on the rendered image, and a specification of environmental illumination conditions.

37. The display device of embodiment 36, wherein the building structure is at least one of: at least a portion of an actual building structure at a given location, or at least a portion of a planned building structure at the given location.

38. The display device of either of embodiments 36 or 37, wherein each of the plurality of predefined virtual external building-surface elements comprises a digital-image representation of a respective surface-finishing component, the digital image representation being at least one of: a photographic image, or a rendered graphical image.

39. The display device of any of the preceding embodiments, wherein the respective surface-finishing component is one of: a roofing shingle, a roofing tile, a section of roof-finishing membrane, a section of exterior-wall siding, a section of exterior-wall cladding, an exterior-wall brick, an exterior-wall stone, a window, an exterior-wall trim, an exterior-wall window trim, a soffit element, a section of rain gutter, or a section of rain downspout.

40. The display device of any of the preceding embodiments, wherein rendering, in real-time, the one or more of the plurality of the predefined virtual external building-surface elements at respectively specified locations on the rendered image comprises:
   rendering a size and shape of each of the one or more of the plurality of the predefined virtual external building-surface elements based on the respectively specified location and a simulated viewing location with respect to the rendered image.

41. The display device of any of the preceding embodiments, wherein simulating illumination of each of the one or more of the plurality of the predefined virtual external building-surface elements in real-time comprises:
   rendering each of the one or more of the plurality of the predefined virtual external building-surface elements with at least one of: a specified color, or a specified texture map.

42. The display device of any of the preceding embodiments, wherein the data descriptive of the building structure comprise description information, the description information being at least one of: one or more photographic images of the building structure, architectural data descriptive of the building structure, or data descriptive of environmental surroundings of the building structure.

43. The display device of any of the preceding embodiments, wherein physical illumination characteristics comprise: intensity of reflected illumination, intensity of ambient illumination, intensity and direction of direct illumination, angular distribution of illumination, shadow scale, and texture coordinates.

44. The display device of any of the preceding embodiments, wherein simulating the illumination of each of the one or more of the plurality of the predefined virtual external building-surface elements in real-time comprises:
   for each respective one of the one or more of the plurality of the predefined virtual external building-surface elements, graphically rendering physical appearance of the respective predefined virtual external building-surface element at its respectively specified location on the rendered image, subject to its associated illumination characteristics and specified illumination conditions at the given location.

45. The display device of any of the preceding embodiments, wherein the operations further include:
   receiving, in real-time, input data at the interactive display device specifying selection of at least one of: a subset of the plurality of predefined virtual external building-surface elements identifying the one or more of the plurality of the predefined virtual external building-surface elements, the specification of environmental illumination conditions at the given location, or a rendering color of the one or more of the plurality of the predefined virtual external building-surface elements.

46. An article of manufacture including a non-transitory computer-readable medium having stored thereon program instructions for real-time visualization of building structures, wherein the program instructions, upon execution by one or more processors of a system, cause the system to perform operations including:
   calculating physical illumination characteristics for each of a plurality of predefined virtual external building-surface elements layered in simulation at specified surface locations of a virtual three-dimensional (3D) model of a building structure, wherein the virtual 3D model is constructed based on data descriptive of the building structure;
   associating each of the plurality of predefined virtual external building-surface elements with its calculated illumination characteristics in a database;
   on an interactive display device, generating a spatially-manipulable rendered image of the building structure in real-time based on the virtual 3D model;
   on the interactive display device, rendering, in real-time, one or more of the plurality of the predefined virtual external building-surface elements at respectively specified locations on the rendered image; and
   on the interactive display device, simulating illumination of each of the one or more of the plurality of the predefined virtual external building-surface elements in real-time based on its associated calculated illumination characteristics, its respectively specified location on the rendered image, and a specification of environmental illumination conditions.

47. A method for integration of real and virtual images for visualization of building construction, the method comprising:
   in a computing device, constructing a virtual three-dimensional (3D) model of a building structure at a given location based on data descriptive of the building structure;
   in the computing device, generating a rendered image of the building structure as viewed from a simulated viewing point corresponding to an actual viewing point of a camera device during acquisition of an image of the building structure, the rendered image further being based at least on the 3D model and image information associated with the acquired image and comprising data indicative of acquisitional circumstances of the acquired image;
   in the computing device, determining a masked portion of the acquired image occupied only by the building structure; and on a display device, generating a merged image of the acquired image and the rendered image in which the rendered image occupies the masked portion of the acquired image.

48. The method of embodiment 47, wherein the building structure is one of: (i) an entire actual building structure at the given location, or (ii) a building portion of the entire building structure at the given location.

49. The method of either of embodiments 47 or 48, wherein the data descriptive of the building structure comprise description information, the description information being at least one of: one or more photographic images of the building structure and it environmental surroundings, architectural data descriptive of the building structure, or data descriptive of environmental surroundings of the building structure.

50. The method of any of embodiments 47-49, wherein the data indicative of acquisitional circumstances of the acquired image are at least one of: geographic location of the camera device when the acquired image was acquired, position and perspective of the camera device with respect to the building structure when the acquired image was acquired, a timestamp of when the acquired image was acquired, weather conditions at the given location when the acquired image was acquired, position of sun in the sky at the given location when the acquired image was acquired, illumination conditions at the given location when the acquired image was acquired, response characteristics of the camera device, or operational settings of the camera device when the acquired image was acquired.

51. The method of any of embodiments 47-50, the rendered image of the building structure has an apparent size and perspective relative to the simulated viewing point that matches that of the building structure in the acquired image relative to the actual viewing point.

52. The method of any of embodiments 47-51, wherein generating the rendered image of the building structure as viewed from the simulated viewing point corresponding to the actual viewing point comprises determining the simulated viewing point from the stored image information.

53. The method of any of embodiments 47-52, wherein generating the rendered image of the building structure as viewed from the simulated viewing point corresponding to the actual viewing point comprises:
   solving a camera equation to determine a virtual position, orientation, and field of view of a simulated camera with respect to the rendered image of the building structure that match an actual position, orientation, and field of view of the camera device with respect to the building structure; and
   simulating capture of an image of the building structure by the simulated camera using simulated response characteristics matching response characteristics of the camera device when the acquired image was acquired.

54. The method of any of embodiments 47-53, wherein generating the rendered image of the building structure as viewed from the simulated viewing point corresponding to the actual viewing point comprises:
   determining a position and perspective of the camera device with respect to the building structure when the acquired image was acquired; and
   generating the rendered image of the building structure as viewed from a rendering perspective that matches the determined position and perspective of the camera device with respect to the building structure.

55. The method of embodiment 54, wherein determining the position and perspective of the camera device with respect to the building structure comprises determining the position and perspective of the camera device based on the actual viewing point and the given location of the building structure.

56. The method of embodiment 54, wherein determining the position and perspective of the camera device with respect to the building structure comprises:
   determining an apparent size and shape on the acquired image of the building structure of an element having a known size and shape; and
   geometrically determining the position and perspective of the camera device such that the apparent size and shape of the element is reproduced from the known size and shape of the element as viewed from the geometrically determined position and perspective.

57. The method of embodiment 54, wherein determining the position and perspective of the camera device with respect to the building structure further comprises determining the geographic location of the camera device when the acquired image was acquired.

58. The method of any of embodiments 47-57, wherein generating the rendered image of the building structure as viewed from the simulated viewing point corresponding to the actual viewing point comprises generating the rendered image with illumination characteristics matching those of the physical environment at the given location when the acquired image was acquired.

59. The method of embodiment 58, wherein generating the rendered image of the building structure as viewed from the simulated viewing point corresponding to the actual viewing point further comprises determining the illumination characteristics of the physical environment at the given location when the acquired image was acquired.

60. The method of any of embodiments 47-59, wherein generating the rendered image of the building structure as viewed from the simulated viewing point corresponding to the actual viewing point comprises:
   simulating application of one or more virtual surface finishing components on the rendered image of the building structure; and
   simulating illumination of the rendered image, including the one or more surface finishing elements, to match illumination of the physical environment at the given location when the acquired image was acquired.

61. The method of embodiment 60, wherein each of the one or more virtual surface finishing components is at least one of: a virtual roofing shingle, a virtual roofing tile, a virtual section of roof-finishing membrane, a virtual section of exterior-wall siding, a virtual section of exterior-wall cladding, a virtual exterior-wall brick, a virtual exterior-wall stone, a virtual window, a virtual exterior-wall trim, a virtual exterior-wall window trim, a virtual soffit element, a virtual section of rain gutter, or a virtual section of rain downspout.

62. The method of any of embodiments 47-61, wherein determining a masked portion of the acquired image occupied only by the building structure comprises:
   classifying pixels of the acquired image as being one of part of the building structure, or not part of the building structure; and
   identifying the masked portion as being those pixels classified as part of the building structure.

63. The method of embodiment 62, wherein classifying the pixels of the acquired image as being one of part of the building structure, or not part of the building structure comprises:
   applying image segmentation to classify the pixels of the acquired image as being one of part of the building structure, not part of the building structure, or uncertain; and
   applying matting to resolve uncertainty in the image segmentation classification.

64. The method of any of embodiments 47-63, wherein generating a merged image of the acquired image and the rendered image in which the rendered image occupies the masked portion of the acquired image comprises replacing pixels within the masked portion of the acquired image with a rasterized version of the rendered image.

65. A system configured for integration of real and virtual images for visualization of building construction, the system comprising:
   a computing system; and a display device communicatively connected with the computing system, wherein the computing system is configured to:
  construct a virtual three-dimensional (3D) model of a building structure at a given location based on data descriptive of the building structure;
  generate a rendered image of the building structure as viewed from a simulated viewing point corresponding to an actual viewing point of a camera device during acquisition of an image of the building structure, the rendered image further being based at least on the 3D model and image information associated with the acquired image and comprising data indicative of acquisitional circumstances of the acquired image; and
  determine a masked portion of the acquired image occupied only by the building structure,
and wherein the display device is configured to:
  generate a merged image of the acquired image and the rendered image in which the rendered image occupies the masked portion of the acquired image.

66. The system of embodiment 65, wherein the building structure is one of: (i) an entire actual building structure at the given location, or (ii) a building portion of the entire building structure at the given location.

67. The system of either of embodiments 65 or 66, wherein the data descriptive of the building structure comprise description information, the description information being at least one of: one or more photographic images of the building structure and it environmental surroundings, architectural data descriptive of the building structure, or data descriptive of environmental surroundings of the building structure.

68. The system of any of embodiments 65-67, wherein the data indicative of acquisitional circumstances of the acquired image are at least one of: geographic location of the camera device when the acquired image was acquired, position and perspective of the camera device with respect to the building structure when the acquired image was acquired, a timestamp of when the acquired image was acquired, weather conditions at the given location when the acquired image was acquired, position of sun in the sky at the given location when the acquired image was acquired, illumination conditions at the given location when the acquired image was acquired, response characteristics of the camera device, or operational settings of the camera device when the acquired image was acquired.

69. The system of any of embodiments 65-68, the rendered image of the building structure has an apparent size and perspective relative to the simulated viewing point that matches that of the building structure in the acquired image relative to the actual viewing point.

70. The system of any of embodiments 65-69, wherein generating the rendered image of the building structure as viewed from the simulated viewing point corresponding to the actual viewing point comprises determining the simulated viewing point from the stored image information.

71. The system of any of embodiments 65-70, wherein generating the rendered image of the building structure as viewed from the simulated viewing point corresponding to the actual viewing point comprises:
  solving a camera equation to determine a virtual position, orientation, and field of view of a simulated camera with respect to the rendered image of the building structure that match an actual position, orientation, and field of view of the camera device with respect to the building structure; and
  simulating capture of an image of the building structure by the simulated camera using simulated response characteristics matching response characteristics of the camera device when the acquired image was acquired.

72. The system of any of embodiments 65-71, wherein generating the rendered image of the building structure as viewed from the simulated viewing point corresponding to the actual viewing point:
  determining a position and perspective of the camera device with respect to the building structure when the acquired image was acquired; and
  generating the rendered image of the building structure as viewed from a rendering perspective that matches the determined position and perspective of the camera device with respect to the building structure.

73. The system of embodiment 72, wherein determining the position and perspective of the camera device with respect to the building structure comprises determining the position and perspective of the camera device based on the actual viewing point and the given location of the building structure.

74. The system of embodiment 72, wherein determining the position and perspective of the camera device with respect to the building structure comprises:
  determining an apparent size and shape on the acquired image of the building structure of an element having a known size and shape; and
  geometrically determining the position and perspective of the camera device such that the apparent size and shape of the element is reproduced from the known size and shape of the element as viewed from the geometrically determined position and perspective.

75. The system of embodiment 72, wherein determining the position and perspective of the camera device with respect to the building structure further comprises determining the geographic location of the camera device when the acquired image was acquired.

76. The system of any of embodiments 65-75, wherein generating the rendered image of the building structure as viewed from the simulated viewing point corresponding to the actual viewing point comprises generating the rendered image with illumination characteristics matching those of the physical environment at the given location when the acquired image was acquired.

77. The system of embodiment 76, wherein generating the rendered image of the building structure as viewed from the simulated viewing point corresponding to the actual viewing point further comprises determining the illumination characteristics of the physical environment at the given location when the acquired image was acquired.

78. The system of any of embodiments 65-77, wherein generating the rendered image of the building structure as viewed from the simulated viewing point corresponding to the actual viewing point comprises:
  simulating application of one or more virtual surface finishing components on the rendered image of the building structure; and
  simulating illumination of the rendered image, including the one or more surface finishing elements, to match illumination of the physical environment at the given location when the acquired image was acquired.

79. The system of embodiment 78, wherein each of the one or more virtual surface finishing components is at least one of: a virtual roofing shingle, a virtual roofing tile, a virtual section of roof-finishing membrane, a virtual section of exterior-wall siding, a virtual section of exterior-wall cladding, a virtual exterior-wall brick, a virtual exterior-wall stone, a virtual window, a virtual exterior-wall trim, a virtual exterior-wall window trim, a virtual soffit element, a virtual section of rain gutter, or a virtual section of rain downspout.

80. The system of any of embodiments 65-79, wherein determining a masked portion of the acquired image occupied only by the building structure comprises:
classifying pixels of the acquired image as being one of part of the building structure, or not part of the building structure; and
identifying the masked portion as being those pixels classified as part of the building structure.

81. The system of embodiment 80, wherein classifying the pixels of the acquired image as being one of part of the building structure, or not part of the building structure comprises:
applying image segmentation to classify the pixels of the acquired image as being one of part of the building structure, not part of the building structure, or uncertain; and
applying matting to resolve uncertainty in the image segmentation classification.

82. The system of any of embodiments 65-81, generating a merged image of the acquired image and the rendered image in which the rendered image occupies the masked portion of the acquired image comprises replacing pixels within the masked portion of the acquired image with a rasterized version of the rendered image.

83. A computing system configured for integration of real and virtual images for visualization of building construction, the computing system comprising:
one or more processors; and
memory storing instructions that, when executed by the one more processors, cause the computing system to carry out operations including:
constructing a virtual three-dimensional (3D) model of a building structure at a given location based on data descriptive of the building structure;
generating a rendered image of the building structure as viewed from a simulated viewing point corresponding to an actual viewing point of a camera device during acquisition of an image of the building structure, the rendered image further being based at least on the 3D model and image information associated with the acquired image and comprising data indicative of acquisitional circumstances of the acquired image;
determining a masked portion of the acquired image occupied only by the building structure and,
wherein the acquired image and the rendered image are configured to be merged by replacing the masked portion with the acquired image.

84. The computing system of embodiment 83, wherein the building structure is one of: (i) an entire actual building structure at the given location, or (ii) a building portion of the entire building structure at the given location.

85. The computing system of either of embodiments 83 or 84, wherein the data descriptive of the building structure comprise description information, the description information being at least one of: one or more photographic images of the building structure and it environmental surroundings, architectural data descriptive of the building structure, or data descriptive of environmental surroundings of the building structure.

86. The computing system of any of embodiments 83-85, wherein the data indicative of acquisitional circumstances of the acquired image are at least one of: geographic location of the camera device when the acquired image was acquired, position and perspective of the camera device with respect to the building structure when the acquired image was acquired, a timestamp of when the acquired image was acquired, weather conditions at the given location when the acquired image was acquired, position of sun in the sky at the given location when the acquired image was acquired, illumination conditions at the given location when the acquired image was acquired, response characteristics of the camera device, or operational settings of the camera device when the acquired image was acquired.

87. The computing system of any of embodiments 83-86, the rendered image of the building structure has an apparent size and perspective relative to the simulated viewing point that matches that of the building structure in the acquired image relative to the actual viewing point.

88. The computing system of any of embodiments 83-87, wherein generating the rendered image of the building structure as viewed from the simulated viewing point corresponding to the actual viewing point comprises determining the simulated viewing point from the stored image information.

89. The computing system of any of embodiments 83-88, wherein generating the rendered image of the building structure as viewed from the simulated viewing point corresponding to the actual viewing point comprises:
solving a camera equation to determine a virtual position, orientation, and field of view of a simulated camera with respect to the rendered image of the building structure that match an actual position, orientation, and field of view of the camera device with respect to the building structure; and
simulating capture of an image of the building structure by the simulated camera using simulated response characteristics matching response characteristics of the camera device when the acquired image was acquired.

90. The computing system of any of embodiments 83-89, wherein generating the rendered image of the building structure as viewed from the simulated viewing point corresponding to the actual viewing point:
determining a position and perspective of the camera device with respect to the building structure when the acquired image was acquired; and
generating the rendered image of the building structure as viewed from a rendering perspective that matches the determined position and perspective of the camera device with respect to the building structure.

91. The computing system of embodiment 90, wherein determining the position and perspective of the camera device with respect to the building structure comprises determining the position and perspective of the camera device based on the actual viewing point and the given location of the building structure.

92. The computing system of embodiment 90, wherein determining the position and perspective of the camera device with respect to the building structure comprises:

determining an apparent size and shape on the acquired image of the building structure of an element having a known size and shape; and geometrically determining the position and perspective of the camera device such that the apparent size and shape of the element is reproduced from the known size and shape of the element as viewed from the geometrically determined position and perspective.

93. The computing system of embodiment 90, wherein determining the position and perspective of the camera device with respect to the building structure further comprises determining the geographic location of the camera device when the acquired image was acquired.

94. The computing system of any of embodiments 83-93, wherein generating the rendered image of the building structure as viewed from the simulated viewing point corresponding to the actual viewing point comprises generating the rendered image with illumination characteristics matching those of the physical environment at the given location when the acquired image was acquired.

95. The computing system of embodiment 94, wherein generating the rendered image of the building structure as viewed from the simulated viewing point corresponding to the actual viewing point further comprises determining the illumination characteristics of the physical environment at the given location when the acquired image was acquired.

96. The computing system of any of embodiments 83-95, wherein generating the rendered image of the building structure as viewed from the simulated viewing point corresponding to the actual viewing point comprises:
    simulating application of one or more virtual surface finishing components on the rendered image of the building structure; and
    simulating illumination of the rendered image, including the one or more surface finishing elements, to match illumination of the physical environment at the given location when the acquired image was acquired.

97. The computing system of embodiment 96, wherein each of the one or more virtual surface finishing components is at least one of: a virtual roofing shingle, a virtual roofing tile, a virtual section of roof-finishing membrane, a virtual section of exterior-wall siding, a virtual section of exterior-wall cladding, a virtual exterior-wall brick, a virtual exterior-wall stone, a virtual window, a virtual exterior-wall trim, a virtual exterior-wall window trim, a virtual soffit element, a virtual section of rain gutter, or a virtual section of rain downspout.

98. The computing system of any of embodiments 83-97, wherein determining a masked portion of the acquired image occupied only by the building structure comprises:
    classifying pixels of the acquired image as being one of part of the building structure, or not part of the building structure; and
    identifying the masked portion as being those pixels classified as part of the building structure.

99. The computing system of embodiment 98, wherein classifying the pixels of the acquired image as being one of part of the building structure, or not part of the building structure comprises:
    applying image segmentation to classify the pixels of the acquired image as being one of part of the building structure, not part of the building structure, or uncertain; and
    applying matting to resolve uncertainty in the image segmentation classification.

100. A display device configured for integration of real and virtual images for visualization of building construction, the display device comprising:
    a graphical display component;
    one or more processors; and
    memory storing instructions that, when executed by the one or more processors, cause the display device to carry out operations including:
    generating a merged image of an acquired image of a building structure and a simulated image of the building structure by replacing a masked portion of the acquired image occupied only by the building structure with the rendered image,
    wherein the simulated image comprises:
        a rendered image of the building structure as viewed from a simulated viewing point corresponding to an actual viewing point of a camera device during acquisition of the acquired image of the building structure, the rendered image further being based at least on a virtual three-dimensional (3D) model of the building structure and image information associated with the acquired image and comprising data indicative of acquisitional circumstances of the acquired image;
    and wherein the virtual 3D model of a building structure is constructed based on at a data descriptive of the building structure.

101. The display device of embodiment 100, wherein the building structure is one of: (i) an entire actual building structure at the given location, or (ii) a building portion of the entire building structure at the given location.

102. The display device of either of embodiments 100 or 101, wherein the data descriptive of the building structure comprise description information, the description information being at least one of: one or more photographic images of the building structure and it environmental surroundings, architectural data descriptive of the building structure, or data descriptive of environmental surroundings of the building structure.

103. The display device of any of embodiments 100-102, wherein the data indicative of acquisitional circumstances of the acquired image are at least one of: geographic location of the camera device when the acquired image was acquired, position and perspective of the camera device with respect to the building structure when the acquired image was acquired, a timestamp of when the acquired image was acquired, weather conditions at the given location when the acquired image was acquired, position of sun in the sky at the given location when the acquired image was acquired, illumination conditions at the given location when the acquired image was acquired, response characteristics of the camera device, or operational settings of the camera device when the acquired image was acquired.

104. The display device of any of embodiments 100-103, the rendered image of the building structure has an apparent size and perspective relative to the simulated viewing point that matches that of the building structure in the acquired image relative to the actual viewing point.

105. The display device of any of embodiments 100-104, wherein the rendered image of the building structure comprises:
   one or more virtual surface finishing components layered on the rendered image of the building structure; and
   simulated illumination of the rendered image, including the one or more surface finishing elements, to match illumination of the physical environment at the given location when the acquired image was acquired.
106. The display device of embodiment 105, wherein each of the one or more virtual surface finishing components is at least one of: a virtual roofing shingle, a virtual roofing tile, a virtual section of roof-finishing membrane, a virtual section of exterior-wall siding, a virtual section of exterior-wall cladding, a virtual exterior-wall brick, a virtual exterior-wall stone, a virtual window, a virtual exterior-wall trim, a virtual exterior-wall window trim, a virtual soffit element, a virtual section of rain gutter, or a virtual section of rain downspout.
107. The display device of any of embodiments 100-106, wherein the masked portion of the acquired image occupied only by the building structure comprises pixels of the acquired image classified as being one of part of the building structure.
108. The display device of any of embodiments 100-107, generating the merged image of the acquired image of the building structure and the simulated image of the building structure by replacing the masked portion of the acquired image occupied only by the building structure with the rendered image comprises replacing pixels within the masked portion of the acquired image with a rasterized version of the rendered image.
109. An article of manufacture including a non-transitory computer-readable medium having stored thereon program instructions for integration of real and virtual images for visualization of building construction, wherein the program instructions, upon execution by one or more processors of a system, cause the system to perform operations including:
   constructing a virtual three-dimensional (3D) model of a building structure at a given location based on data descriptive of the building structure;
   generating a rendered image of the building structure as viewed from a simulated viewing point corresponding to an actual viewing point of a camera device during acquisition of an image of the building structure, the rendered image further being based at least on the 3D model and image information associated with the acquired image and comprising data indicative of acquisitional circumstances of the acquired image;
   determining a masked portion of the acquired image occupied only by the building structure;
   on an interactive display device, generating a merged image of the acquired image and the rendered image in which the rendered image occupies the masked portion of the acquired image.

CONCLUSION

The present disclosure is not to be limited in terms of the particular embodiments described in this application, which are intended as illustrations of various aspects. Many modifications and variations can be made without departing from its scope, as will be apparent to those skilled in the art. Functionally equivalent methods and apparatuses within the scope of the disclosure, in addition to those described herein, will be apparent to those skilled in the art from the foregoing descriptions. Such modifications and variations are intended to fall within the scope of the appended claims.

The above detailed description describes various features and operations of the disclosed systems, devices, and methods with reference to the accompanying figures. The example embodiments described herein and in the figures are not meant to be limiting. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations.

While various aspects and embodiments have been disclosed herein, other aspects and embodiments will be apparent to those skilled in the art. The various aspects and embodiments disclosed herein are for purpose of illustration and are not intended to be limiting, with the true scope being indicated by the following claims.

What is claimed is:

1. A system configured for integration of real and virtual images for visualization of building construction, the system comprising:
   a computing system; and
   a display device communicatively connected with the computing system,
   wherein the computing system is configured to:
   construct a virtual three-dimensional (3D) model of a building structure at a given location based on data descriptive of the building structure;
   generate a rendered image of the building structure as viewed from a simulated viewing point corresponding to an actual viewing point of a camera device during acquisition of an image of the building structure, the rendered image further being based at least on the 3D model and image information associated with the acquired image and comprising data indicative of acquisitional circumstances of the acquired image; and
   determine a masked portion of the acquired image occupied only by the building structure,
   and wherein the display device is configured to:
   generate a merged image of the acquired image and the rendered image in which the rendered image occupies the masked portion of the acquired image;
   wherein generating the rendered image of the building structure as viewed from the simulated viewing point corresponding to the actual viewing point comprises:
   determining a position and perspective of the camera device with respect to the building structure when the acquired image was acquired; and
   generating the rendered image of the building structure as viewed from a rendering perspective that matches the determined position and perspective of the camera device with respect to the building structure,
   wherein determining the position and perspective of the camera device with respect to the building structure comprises at least one of the following:
   1) determining the position and perspective of the camera device based on the actual viewing point and the given location of the building structure;
   2) determining an apparent size and shape on the acquired image of the building structure of an element having a known size and shape, and geometrically determining the position and perspective of the camera device such that the apparent size and shape of the element is reproduced from the known size and shape of the element as viewed from the geometrically determined position and perspective; or 3) determining the geographic location of the camera device when the acquired image was acquired.

2. The system of claim 1, wherein the data descriptive of the building structure comprise description information, the description information being at least one of: one or more photographic images of the building structure and it environmental surroundings, architectural data descriptive of the building structure, or data descriptive of environmental surroundings of the building structure.

3. The system of claim 1, the rendered image of the building structure has an apparent size and perspective relative to the simulated viewing point that matches that of the building structure in the acquired image relative to the actual viewing point.

4. The system of claim 1, wherein generating the rendered image of the building structure as viewed from the simulated viewing point corresponding to the actual viewing point comprises determining the simulated viewing point from the stored image information.

5. The system of claim 1, wherein generating the rendered image of the building structure as viewed from the simulated viewing point corresponding to the actual viewing point comprises:

solving a camera equation to determine a virtual position, orientation, and field of view of a simulated camera with respect to the rendered image of the building structure that match an actual position, orientation, and field of view of the camera device with respect to the building structure; and simulating capture of an image of the building structure by the simulated camera using simulated response characteristics matching response characteristics of the camera device when the acquired image was acquired.

6. The system of claim 1, wherein determining the position and perspective of the camera device with respect to the building structure comprises determining the position and perspective of the camera device based on the actual viewing point and the given location of the building structure.

7. The system of claim 1, wherein determining the position and perspective of the camera device with respect to the building structure comprises:

determining an apparent size and shape on the acquired image of the building structure of an element having a known size and shape; and geometrically determining the position and perspective of the camera device such that the apparent size and shape of the element is reproduced from the known size and shape of the element as viewed from the geometrically determined position and perspective.

8. The system of claim 1, wherein determining the position and perspective of the camera device with respect to the building structure further comprises determining the geographic location of the camera device when the acquired image was acquired.

9. The system of claim 1, wherein generating the rendered image of the building structure as viewed from the simulated viewing point corresponding to the actual viewing point comprises generating the rendered image with illumination characteristics matching those of the physical environment at the given location when the acquired image was acquired.

10. A display device configured for integration of real and virtual images for visualization of building construction, the display device comprising:

a graphical display component;
one or more processors; and
memory storing instructions that, when executed by the one or more processors, cause the display device to carry out operations including:

generating a merged image of an acquired image of a building structure and a simulated image of the building structure by replacing a masked portion of the acquired image occupied only by the building structure with the rendered image, wherein generating the merged image of the acquired image of the building structure and the simulated image of the building structure by replacing the masked portion of the acquired image occupied only by the building structure with the rendered image comprises replacing pixels within the masked portion of the acquired image with a rasterized version of the rendered image, wherein the simulated image comprises:

a rendered image of the building structure as viewed from a simulated viewing point corresponding to an actual viewing point of a camera device during acquisition of the acquired image of the building structure, the rendered image further being based at least on a virtual three-dimensional (3D) model of the building structure and image information associated with the acquired image and comprising data indicative of acquisitional circumstances of the acquired image;

and wherein the virtual 3D model of a building structure is constructed based on at a data descriptive of the building structure.

11. The display device of claim 10, wherein the building structure is one of: (i) an entire actual building structure at the given location, or (ii) a building portion of the entire building structure at the given location.

12. The display device of claim 10, wherein the data descriptive of the building structure comprise description information, the description information being at least one of: one or more photographic images of the building structure and it environmental surroundings, architectural data descriptive of the building structure, or data descriptive of environmental surroundings of the building structure.

13. The display device of claim 10, wherein the data indicative of acquisitional circumstances of the acquired image are at least one of: geographic location of the camera device when the acquired image was acquired, position and perspective of the camera device with respect to the building structure when the acquired image was acquired, a timestamp of when the acquired image was acquired, weather conditions at the given location when the acquired image was acquired, position of sun in the sky at the given location when the acquired image was acquired, illumination conditions at the given location when the acquired image was acquired, response characteristics of the camera device, or operational settings of the camera device when the acquired image was acquired.

14. The display device of claim 10, the rendered image of the building structure has an apparent size and perspective relative to the simulated viewing point that matches that of the building structure in the acquired image relative to the actual viewing point.

15. The display device of claim 10, wherein the rendered image of the building structure comprises:

one or more virtual surface finishing components layered on the rendered image of the building structure; and simulated illumination of the rendered image, including the one or more surface finishing elements, to match illumination of the physical environment at the given location when the acquired image was acquired.

16. The display device of claim 15, wherein each of the one or more virtual surface finishing components is at least one of: a virtual roofing shingle, a virtual roofing tile, a virtual section of roof-finishing membrane, a virtual section of exterior-wall siding, a virtual section of exterior-wall cladding, a virtual exterior-wall brick, a virtual exterior-wall stone, a virtual window, a virtual exterior-wall trim, a virtual exterior-wall window trim, a virtual soffit element, a virtual section of rain gutter, or a virtual section of rain downspout.

17. The display device of claim 10, wherein the masked portion of the acquired image occupied only by the building structure comprises pixels of the acquired image classified as being one of part of the building structure.

* * * * *